(12) United States Patent
Lee et al.

(10) Patent No.: US 12,310,170 B2
(45) Date of Patent: May 20, 2025

(54) ELECTRONIC PANEL AND METHOD OF MANUFACTURING THE SAME

(71) Applicant: Samsung Display Co., Ltd., Yongin-si (KR)

(72) Inventors: Hyoungsub Lee, Yongin-si (KR); Junghan Seo, Seoul (KR); Wooyong Sung, Seoul (KR); Seungyong Song, Suwon-si (KR); Seungho Yoon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 726 days.

(21) Appl. No.: 17/562,930

(22) Filed: Dec. 27, 2021

(65) Prior Publication Data

US 2022/0123259 A1    Apr. 21, 2022

Related U.S. Application Data

(63) Continuation of application No. 16/376,845, filed on Apr. 5, 2019, now Pat. No. 11,211,584.

(30) Foreign Application Priority Data

May 18, 2018    (KR) .......................... 10-2018-0057159

(51) Int. Cl.
*H10K 50/844*    (2023.01)
*H10K 59/122*    (2023.01)

(52) U.S. Cl.
CPC ......... *H10K 50/844* (2023.02); *H10K 59/122* (2023.02)

(58) Field of Classification Search
CPC ...... G09F 9/335; H10K 50/844; H10K 59/12; H10K 59/1201; H10K 59/121;
(Continued)

(56) References Cited

U.S. PATENT DOCUMENTS 9,632,487 B2    4/2017 Kim et al.
2013/0120414 A1    5/2013 Sasagawa
(Continued)

FOREIGN PATENT DOCUMENTS

KR    10-2017-0015632 A    2/2017
KR    10-2017-0059864 A    5/2017
(Continued)

*Primary Examiner* — Michelle Mandala
*Assistant Examiner* — Kevin Quinto
(74) *Attorney, Agent, or Firm* — Womble Bond Dickinson (US) LLP

(57) ABSTRACT

An electronic panel comprises a base substrate which comprises a front surface comprising a hole area and a display area surrounding the hole area and a rear surface and comprises a module hole located in the hole area and a plurality of recess patterns located in the hole area, a plurality of pixels, an encapsulation layer covering the pixels and comprising a first inorganic layer, a second inorganic layer, and an organic layer, and a protective pattern located in the hole area and spaced apart from the organic layer when viewed in a plan view. The recess patterns comprise a filled recess pattern filled with at least one of the organic layer or the protective pattern, and an exposed recess pattern exposed from the organic layer and the protective pattern.

18 Claims, 26 Drawing Sheets

(58) Field of Classification Search
CPC ............... H10K 59/122; H10K 59/873; H10K 59/8731; H10K 71/00; H10K 71/13
See application file for complete search history.

(56) References Cited

U.S. PATENT DOCUMENTS

| | | | |
|---|---|---|---|
| 2016/0202447 A1* | 7/2016 | Gutierrez | ................ G02B 7/08 29/602.1 |
| 2017/0148856 A1* | 5/2017 | Choi | .................... H10K 59/873 |
| 2017/0162111 A1 | 6/2017 | Kang et al. | |
| 2017/0162637 A1 | 6/2017 | Choi et al. | |
| 2017/0237038 A1 | 8/2017 | Kim et al. | |
| 2017/0288004 A1* | 10/2017 | Kim | .................... H10K 59/124 |
| 2019/0252475 A1 | 8/2019 | Sung et al. | |

FOREIGN PATENT DOCUMENTS

| | | |
|---|---|---|
| KR | 10-2017-0065059 A | 6/2017 |
| KR | 10-2017-0066767 A | 6/2017 |
| KR | 10-2019-0098703 A | 8/2019 |

\* cited by examiner

ELECTRONIC PANEL AND METHOD OF MANUFACTURING THE SAME

CROSS-REFERENCE TO RELATED APPLICATIONS

This application is a continuation of U.S. patent application Ser. No. 16/376,845, filed Apr. 5, 2019, now U.S. Pat. No. 11,211,584, which claims priority to and the benefit of Korean Patent Application No. 10-2018-0057159, filed May 18, 2018, the entire content of both of which is incorporated herein by reference.

BACKGROUND

1. Field

Aspects of some example embodiments of the present disclosure relate to an electronic panel and a method of manufacturing the same.

2. Description of the Related Art

An electronic apparatus may be activated by an electrical signal. The electronic apparatus may comprise an electronic panel for displaying an image or sensing an external input. An organic light emitting display panel used as an example of the electronic panel may have low power consumption, high brightness and high response speed characteristics.

The organic light emitting display panel may comprise an organic light emitting element. However, the organic light emitting element may be easily damaged by moisture or oxygen. Thus, external moisture or oxygen should be stably blocked to improve the life span and reliability of the organic light emitting display panel.

The Background section of the present Specification includes information that is intended to provide context to example embodiments, and the information in the present Background section does not necessarily constitute prior art.

SUMMARY

Aspects of some example embodiments of the present disclosure relate to an electronic panel and a method of manufacturing the same, and for example, to an electronic panel with improved reliability and a method of manufacturing the same.

The present disclosure may provide an electronic panel capable of improving process reliability and a method of manufacturing the same.

In an embodiment of the inventive concept, an electronic panel comprises a base substrate comprising: a front surface in which a hole area, a display area surrounding the hole area, and a peripheral area adjacent to the display area are defined in a plan view; and a rear surface opposite to the front surface, the base substrate comprising: a module hole penetrating the front surface and the rear surface in the hole area; and a plurality of recess patterns recessed from the front surface in the hole area, surrounding the module hole and spaced apart from each other; a plurality of pixels located in the display area; an encapsulation layer covering the pixels and comprising a first inorganic layer, a second inorganic layer, and an organic layer located between the first and second inorganic layers; and a protective pattern located in the hole area and spaced apart from the organic layer when viewed in a plan view. The recess patterns comprise a filled recess pattern overlapped with at least one of the organic layer or the protective pattern, and an exposed recess pattern exposed from the organic layer and the protective pattern.

In an embodiment, the exposed recess pattern may be located between the filled recess pattern and the module hole, and the filled recess pattern may be filled with the organic layer.

In an embodiment, the protective pattern may be located between the module hole and the exposed recess pattern when viewed in a plan view.

In an embodiment, the filled recess pattern may be located between the exposed recess pattern and the module hole, and the filled recess pattern may be filled with the protective pattern.

In an embodiment, the exposed recess pattern may be located between the protective pattern and the organic layer in a plan view and may be spaced apart from the protective pattern and the organic layer.

In an embodiment, the electronic panel may further comprise a partition located between the protective pattern and the organic layer when viewed in a plan view. The partition may be spaced apart from the recess patterns when viewed in a plan view.

In an embodiment, the partition may surround the module hole.

In an embodiment, the filled recess pattern may comprise a first filled recess pattern and a second filled recess pattern which are spaced apart from each other with the exposed recess pattern interposed therebetween when viewed in a plan view. The first filled recess pattern may be covered by the protective pattern, and the second filled recess pattern may be covered by the organic layer.

In an embodiment, the electronic panel may further comprise a lyophilic pattern located at the filled recess pattern. The organic layer or the protective pattern may cover the lyophilic pattern.

In an embodiment, the electronic panel may further comprise a liquid-repellent pattern located at the exposed recess pattern. The second inorganic layer may cover the liquid-repellent pattern.

In an embodiment, the protective pattern may comprise the same material as the organic layer.

In an embodiment, each of the pixels may comprise an organic light emitting element.

In an embodiment, the electronic panel may further comprise a signal line located in the hole area and located between the display area and the recess patterns. The signal line may connect at least two of the pixels, which are spaced apart from each other with the module hole interposed therebetween.

In an embodiment of the inventive concepts, an electronic panel comprises a base substrate comprising: at least one through-hole; and a plurality of recess patterns surrounding the through-hole, the base substrate comprising: a margin area surrounding the through-hole; a groove area which surrounds the margin area and in which the recess patterns are defined; and a display area surrounding the groove area; a plurality of pixels located in the display area and comprising organic light emitting elements, respectively; an encapsulation layer covering the pixels and comprising a first inorganic layer, a second inorganic layer, and an organic layer located between the first and second inorganic layers; and a protective pattern which is located in the margin area, is covered by the second inorganic layer, and absorbs light of a laser wavelength. The protective pattern is spaced apart from the organic layer with at least one of the recess patterns interposed therebetween when viewed in a plan view.

In an embodiment, one of the recess patterns may be spaced apart from the protective pattern and the organic layer, and another of the recess patterns may be filled with the organic layer.

In an embodiment, the recess patterns may have undercut shapes.

In an embodiment, the electronic panel may further comprise a liquid-repellent pattern located at the one recess pattern. The liquid-repellent pattern may be covered by the second inorganic layer.

In an embodiment of the inventive concept, a method of manufacturing an electronic panel comprises providing an initial panel comprising a hole area comprising recess patterns and a display area surrounding the hole area, wherein the recess patterns are spaced apart from each other and have circular shapes in a plan view, and organic light emitting elements are located in the display area; providing a first liquid organic material to the display area; providing a second liquid organic material to the hole area; hardening the first liquid organic material to form an organic layer overlapping with the display area; hardening the second liquid organic material to form an initial protective pattern overlapping with the hole area; and irradiating laser to the hole area to form a module hole penetrating the initial panel. The laser removes a portion of the initial protective pattern to form a protective pattern having a sidewall exposed by the module hole.

In an embodiment, the second liquid organic material may absorb at least a portion of the laser.

In an embodiment, at least one of the recess patterns may be filled with at least one of the first liquid organic material or the second liquid organic material, and at least another of the recess patterns may be exposed from the first liquid organic material and the second liquid organic material.

BRIEF DESCRIPTION OF THE DRAWINGS

The accompanying drawings are comprised to provide a further understanding of aspects of some example embodiments of the inventive concept, and are incorporated in and constitute a part of this specification. The drawings illustrate aspects of some example embodiments of the inventive concept and, together with the description, serve to explain principles and characteristics of some example embodiments of the inventive concept. In the drawings.

DETAILED DESCRIPTION

Figure 1:
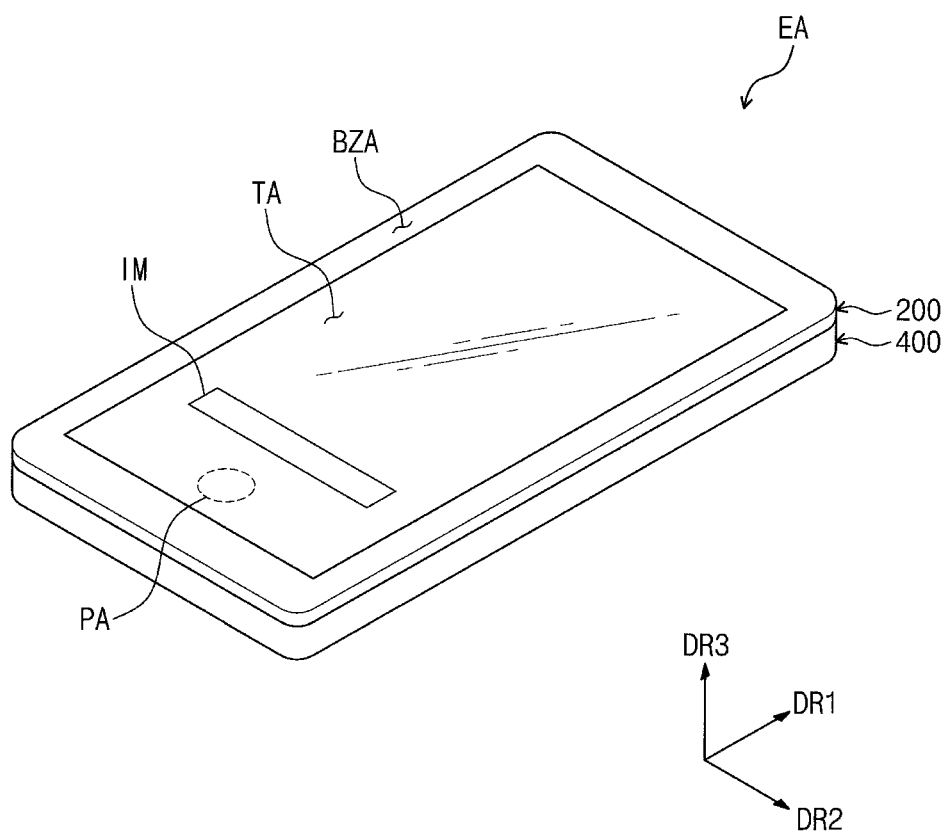
FIG. 1 is a perspective view illustrating an electronic apparatus according to some example embodiments.

Aspects of some example embodiments of the inventive concept will now be described more fully hereinafter with reference to the accompanying drawings, in which various example embodiments are shown. The inventive concept may, however, be embodied in many different forms, and should not be construed as limited to the example embodiments set forth herein. Rather, these embodiments are provided so that this disclosure will be more thorough and more complete, and will more fully convey the aspects of the inventive concept to those skilled in the art. Like reference numerals refer to like elements throughout. It will be understood that when an element such as a layer, region or substrate is referred to as being "on" another element, it can be directly on the other element or intervening elements may be present. In contrast, the term "directly" means that there are no intervening elements. As used herein, the term "and/or" comprises any and all combinations of one or more of the associated listed items.

The terminology used herein is for the purpose of describing particular embodiments only and is not intended to be limiting. As used herein, the singular forms "a," "an," and "the" are intended to comprise the plural forms, comprising "at least one," unless the content clearly indicates otherwise. "Or" means "and/or." As used herein, the term "and/or" comprises any and all combinations of one or more of the associated listed items. It will be further understood that the terms "comprises" and/or "comprising," or "comprises" and/or "comprising" when used in this specification, specify the presence of stated features, regions, integers, steps, operations, elements, and/or components, but do not preclude the presence or addition of one or more other features, regions, integers, steps, operations, elements, components, and/or groups thereof. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Figure 2A:
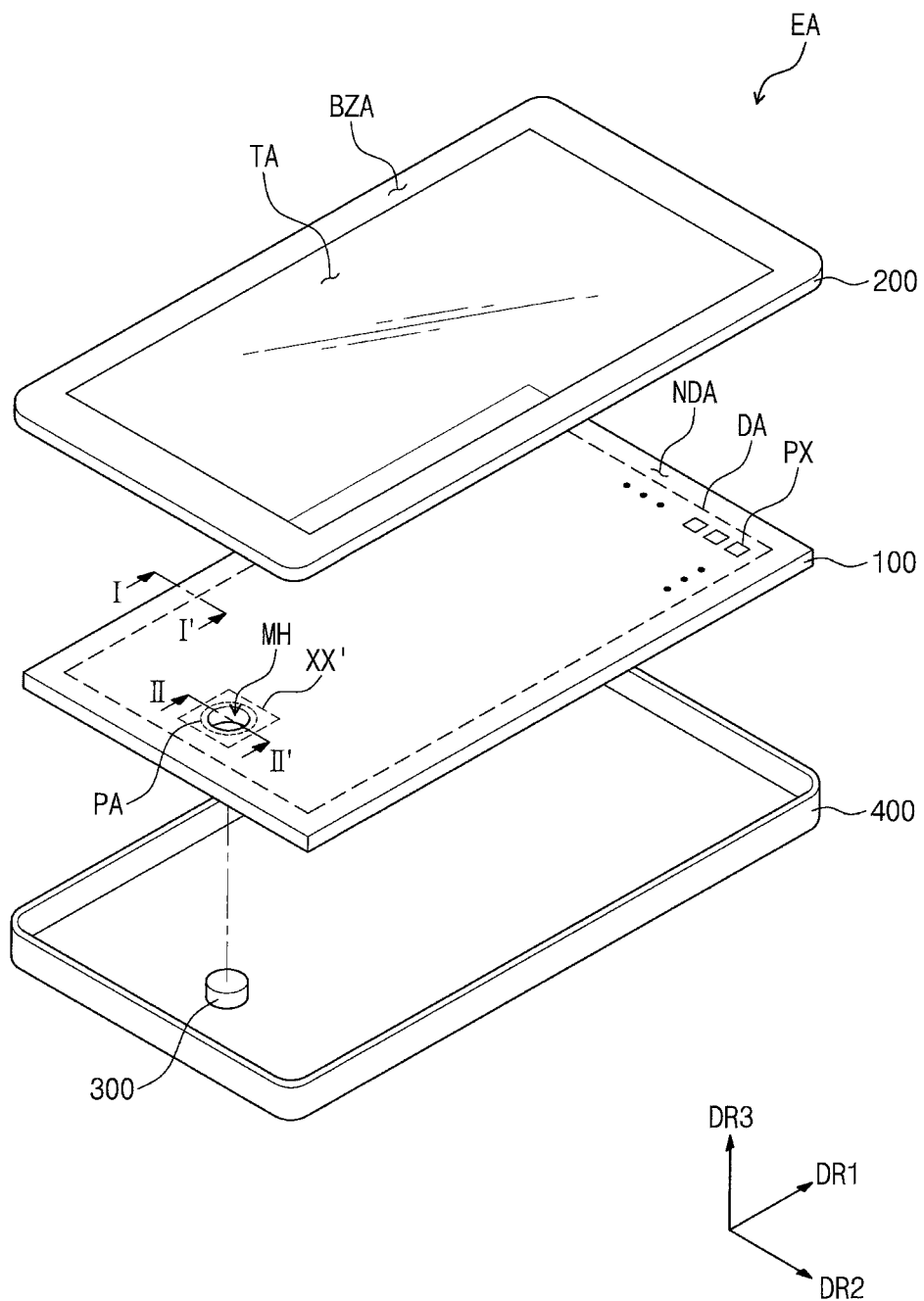
FIG. 2A is an exploded perspective view illustrating the electronic apparatus of FIG. 1.
Figure 2B:
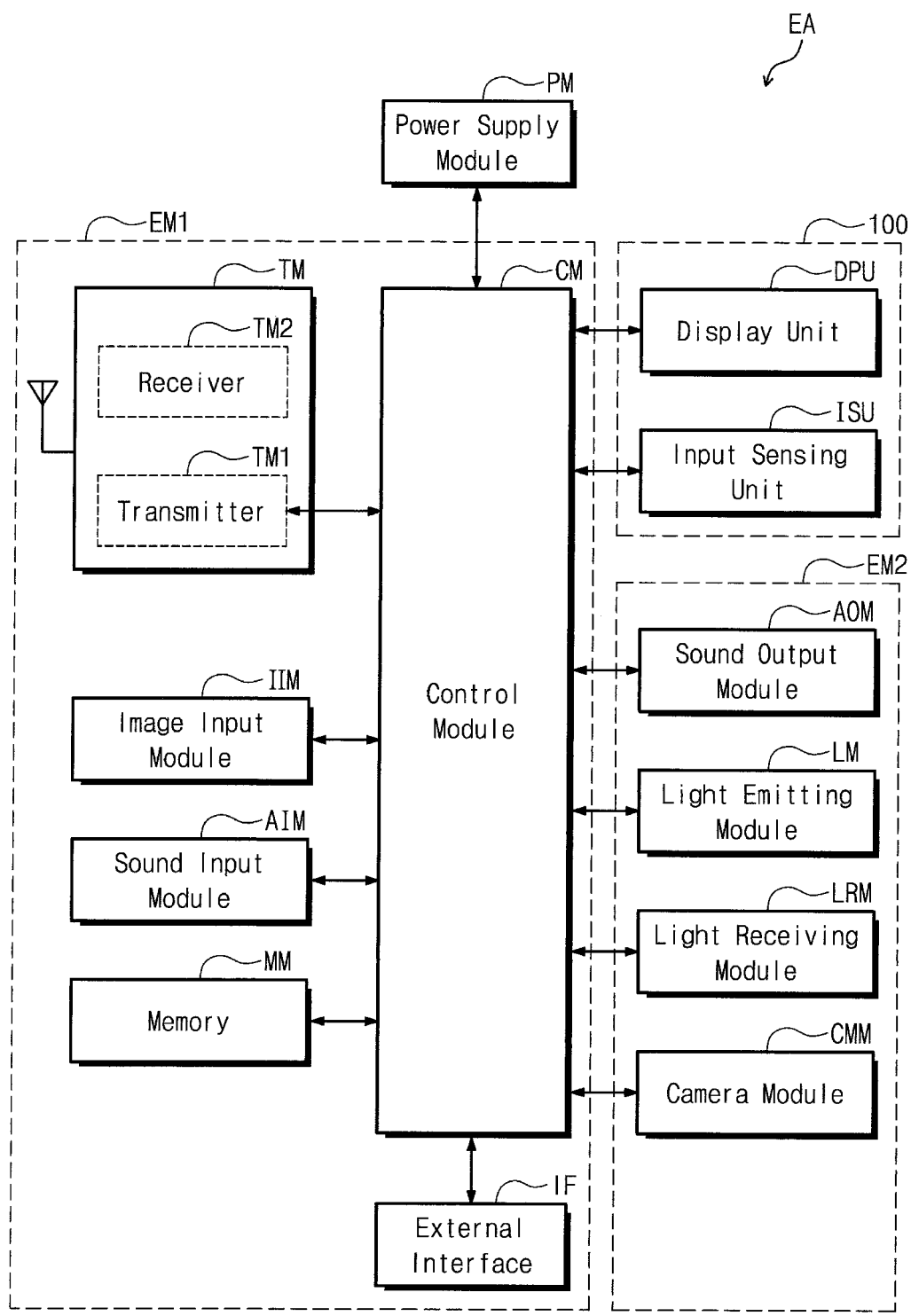
FIG. 2B is a block diagram of the electronic apparatus of FIG. 1.

FIG. 1 is a perspective view illustrating an electronic apparatus according to some example embodiments. FIG. 2A is an exploded perspective view illustrating the electronic apparatus of FIG. 1. FIG. 2B is a block diagram of the electronic apparatus of FIG. 1. Hereinafter, the electronic apparatus according to some example embodiments of the inventive concept will be described with reference to FIGS. 1, 2A and 2B.

An electronic apparatus EA may be activated by an electrical signal. The electronic apparatus EA may be realized as various embodiments. For example, the electronic apparatus EA may be realized as a tablet, a notebook computer, a personal computer, a smart television, or a smart phone. In the present embodiment, the smart phone is illustrated as an example of the electronic apparatus EA.

As illustrated in FIG. 1, the electronic apparatus EA may provide a display surface for displaying an image IM at its front surface. The display surface may be parallel to a plane defined by a first direction DR1 and a second direction DR2. The display surface may comprise a transmission area TA and a bezel area BZA adjacent to the transmission area TA.

The electronic apparatus EA may display the image IM in the transmission area TA. In FIG. 1, an internet search box is illustrated as an example of the image IM. The transmission area TA may have a quadrilateral shape (e.g., a rectangular shape) parallel to the first and second directions DR1 and DR2. However, embodiments of the inventive concept are not limited thereto. In other embodiments, the shape of the transmission area TA may be variously modified.

The bezel area BZA may be adjacent to the transmission area TA. The bezel area BZA may surround the transmission area TA when viewed in a plan view. However, embodiments of the inventive concept are not limited thereto. In other embodiments, the bezel area BZA may be adjacent to only one side of the transmission area TA or may be omitted. The electronic apparatus EA according to some example embodiments of the inventive concepts may be variously embodied and is not limited to a specific embodiment.

A normal direction of the display surface may correspond to a thickness direction DR3 (hereinafter, referred to as a third direction) of the electronic apparatus EA. In the present embodiment, a front surface (or a top surface) and a rear surface (or a bottom surface) of each member are defined by a direction (e.g., the third direction DR3) in which the image IM is displayed. The front surface and the rear surface are opposite to each other in the third direction DR3.

However, directions indicated by the first to third directions DR1, DR2 and DR3 may be relative concepts and may be changed into other directions.

As illustrated in FIG. 2A, the electronic apparatus EA may comprise an electronic panel 100, a window member 200, an electronic module 300, and a receiving member 400. For example, as illustrated in FIG. 2B, the electronic apparatus EA may comprise the electronic panel 100, a first electronic module EM1, a second electronic module EM2, and a power supply module PM. Some of components illustrated in FIG. 2B are omitted in FIG. 2A. Hereinafter, the electronic apparatus EA will be described in more detail with reference to FIGS. 2A and 2B.

The electronic panel 100 may display the image IM and/or may sense an external input provided from the outside. For example, the electronic panel 100 may comprise a display unit DPU for displaying the image IM and an input sensing unit ISU for sensing the external input.

The input sensing unit ISU may sense the external input provided from the outside. The external input may comprise at least one of various external inputs such as a part (e.g., a finger) of the body of a user, light, heat, and pressure. The external input may be applied to the window member 200.

The display unit DPU and the input sensing unit ISU may be formed independently of each other and may be physically coupled to each other by an adhesive member. Alternatively, the display unit DPU and the input sensing unit ISU may be sequentially stacked on a single base substrate.

Meanwhile, one of the display unit DPU and the input sensing unit ISU may be omitted in the electronic panel 100 according to an embodiment of the inventive concepts. The present embodiment illustrates the electronic panel 100 in which the display unit DPU is comprised but the input sensing unit ISU is omitted.

Referring to FIG. 2A, the electronic panel 100 may comprise a display area DA, a peripheral area (or non-display area) NDA, and a hole area PA, which are defined when viewed in a plan view. The display area DA may be an area in which the image IM is displayed. The electronic panel 100 may comprise a pixel PX located in the display area DA. The pixel PX may be provided in plurality, and the plurality of pixels PX may be arranged in the display area DA. Lights generated from the pixels PX may form the image IM.

The peripheral area NDA may be covered by the bezel area BZA. The peripheral area NDA may be adjacent to the display area DA. The peripheral area NDA may surround the display area DA when viewed in a plan view. A driving circuit and/or driving lines for driving the display area DA may be located in the peripheral area NDA.

In an embodiment, a portion of the peripheral area NDA of the electronic panel 100 may be bent. Thus, a portion of the peripheral area NDA may face the front surface of the electronic apparatus EA, and another portion of the peripheral area NDA may face a rear surface of the electronic apparatus EA. Alternatively, the peripheral area NDA may be omitted in the electronic panel 100 according to some example embodiments of the inventive concept.

The hole area PA may be an area in which a module hole MH is defined. The electronic panel 100 according to some example embodiments of the inventive concept may comprise at least one module hole MH.

An edge of the hole area PA may be surrounded by the display area DA when viewed in a plan view. The hole area PA may be spaced apart from the peripheral area NDA with the display area DA interposed therebetween when viewed in a plan view. The module hole MH may be located in the hole area PA. Thus, the module hole MH may be surrounded by the display area DA for displaying the image IM, when viewed in a plan view.

The module hole MH may penetrate the electronic panel 100. The module hole MH may be a through-hole which penetrates the electronic panel 100 from a front surface of the electronic panel 100 to a rear surface of the electronic panel 100. The module hole MH may have a cylindrical shape having a height in the third direction DR3. The module hole MH may overlap with the electronic module 300 when viewed in a plan view. The electronic module 300 may be received in the module hole MH or may have a similar size to a size of the module hole MH. A component which is located on the rear surface of the electronic panel 100 and overlaps with the module hole MH may be visible through the module hole MH in front of the electronic panel 100. The electronic module 300 may receive an external input through the module hole MH. The electronic module 300 will be described later in more detail.

The window member 200 may provide the front surface of the electronic apparatus EA. The window member 200 may be located on the front surface of the electronic panel 100 to protect the electronic panel 100. For example, the window member 200 may comprise a glass substrate, a sapphire substrate, ora plastic film. The window member 200 may have a single-layered or multi-layered structure. For example, the window member 200 may have a stack structure comprising a plurality of plastic films coupled to each other by an adhesive or may have a stack structure which comprises a glass substrate and a plastic film coupled to each other by an adhesive.

The window member 200 may comprise the transmission area TA and the bezel area BZA. The transmission area TA may transmit light incident thereto. The transmission area TA may have a shape corresponding to the shape of the display area DA. For example, the transmission area TA may overlap with the whole or at least a portion of the display area DA. The image IM displayed in the display area DA of the electronic panel 100 may be visible to the outside through the transmission area TA.

A light transmittance of the bezel area BZA may be less than a light transmittance of the transmission area TA. The bezel area BZA may define the shape of the transmission area TA. The bezel area BZA may be adjacent to the transmission area TA and may surround the transmission area TA in a plan view.

The bezel area BZA may have a predetermined color. The bezel area BZA may cover the peripheral area NDA of the electronic panel 100 to prevent or reduce instances of the peripheral area NDA being visible to the outside. However, embodiments of the inventive concepts are not limited thereto. In another embodiment of the inventive concepts, the bezel area BZA may be omitted in the window member 200.

The receiving member 400 may be coupled to the window member 200. The receiving member 400 may provide a rear surface of the electronic apparatus EA. The receiving member 400 may be coupled to the window member 200 to define an inner space.

The receiving member 400 may be formed of a material having relatively high rigidity. For example, the receiving member 400 may comprise a plurality of frames and/or plates, which is formed of glass, plastic, and/or a metal. The receiving member 400 may stably protect the components of the electronic apparatus EA received in the inner space from an external impact. The electronic panel 100 and the various components illustrated in FIG. 2B may be received in the inner space provided by the receiving member 400.

Referring to FIG. 2B, the electronic apparatus EA may comprise the power supply module PM, the first electronic module EM1, and the second electronic module EM2. The power supply module PM may supply power necessary for overall operations of the electronic apparatus EA. The power supply module PM may comprise a battery module.

The first electronic module EM1 and the second electronic module EM2 may comprise various functional modules for operating the electronic apparatus EA. The first electronic module EM1 may be mounted directly on a motherboard electrically connected to the electronic panel 100. Alternatively, the first electronic module EM1 may be mounted on an additional board so as to be electrically connected to the motherboard through a connector.

The first electronic module EM1 may comprise a control module CM, a wireless communication module TM, an image input module IIM, a sound input module AIM, a memory MM, and an external interface IF. In an embodiment, some of the components (e.g., the modules) may not be mounted on the motherboard but may be electrically connected to the motherboard through a flexible circuit board.

The control module CM may control overall operations of the electronic apparatus EA. The control module CM may comprise a microprocessor. For example, the control module CM may activate or deactivate the electronic panel 100. The control module CM may control other module(s) (e.g., the image input module IIM, the sound input module AIM, etc.) on the basis of a touch signal received from the electronic panel 100.

The wireless communication module TM may transmit/receive a wireless signal to/from other terminal(s) by using Bluetooth or Wi-Fi. The wireless communication module TM may transmit/receive a voice signal by using a general communication line. The wireless communication module TM may comprise a transmitter TM1 which is configured to modulate a signal to be transmitted and to transmit the modulated signal, and a receiver TM2 which is configured to demodulate a received signal.

The image input module IIM may process image signals to convert the image signals into image data usable in the electronic panel 100. The sound input module AIM may receive an external sound signal through a microphone in a recording mode or a voice recognition mode and may convert the received sound signal into electrical sound data.

The external interface IF may be connected to and interface with an external charger, a cable/wireless data port, and/or a card socket (e.g., a memory card or a SIM/UIM card).

The second electronic module EM2 may comprise a sound output module AOM, a light emitting module LM, a light receiving module LRM, and a camera module CMM. The components of the second electronic module EM2 may be mounted directly on the motherboard or may be mounted on an additional board so as to be electrically connected to the electronic panel 100 and/or the first electronic module EM1 through a connector.

The sound output module AOM may convert sound data received from the wireless communication module TM and/or sound data stored in the memory MM and may output the converted sound data to the outside.

The light emitting module LM may generate light and may output the generated light. The light emitting module LM may output infrared light. The light emitting module LM may comprise a light emitting diode (LED) element. The light receiving module LRM may sense infrared light. The light receiving module LRM may be activated when sensing the infrared light of a predetermined level or more. The light receiving module LRM may comprise a CMOS sensor. After the infrared light generated in the light emitting module LM is outputted, the infrared light may be reflected by an external object (e.g., a finger or a face of a user), and the reflected infrared light may be incident to the light receiving module LRM. The camera module CMM may acquire an external image.

The electronic module 300 illustrated in FIG. 2A may receive an external input provided through the module hole MH and/or may provide an output signal through the module hole MH. The electronic module 300 may comprise one of the components (e.g., the modules) of the first and second electronic modules EM1 and EM2. For example, the electronic module 300 may comprise a camera, a speaker, or a sensor for sensing light or heat. The electronic module 300 may sense an external object through the module hole MH or may provide a sound signal (e.g., a voice) to the outside through the module hole MH. In this case, the other components of the first and second electronic modules EM1 and EM2 may be located at other positions. However, embodiments of the inventive concepts are not limited thereto. In another embodiment, the electronic module 300 may comprise at least two of the components of the first and second electronic modules EM1 and EM2. Meanwhile, the electronic apparatus EA according to an embodiment may further comprise a transparent member located between the electronic module 300 and the electronic panel 100. The transparent member may be an optically transparent film such that the external input provided through the module hole MH is transmitted to the electronic module 300 through the transparent member. The transparent member may be adhered to the rear surface of the electronic panel 100 or may be located between the electronic panel 100 and the electronic module 300 without an additional adhesive layer. In certain embodiments, the structure of the electronic apparatus EA may be variously modified or changed and may not be limited to one embodiment.

According to the embodiments of the inventive concepts, since the electronic panel 100 comprises the module hole MH, a space for providing the electronic module 300 may be omitted in and/or outside the peripheral area NDA. In addition, the module hole MH may be defined in the hole area PA surrounded by the display area DA, and thus the electronic module 300 may overlap with the transmission area TA, not the bezel area BZA. As a result, an area (or a size) of the bezel area BZA may be reduced to realize the electronic apparatus EA having a narrow bezel. In addition, when the electronic module 300 is received in the module hole MH, a thin electronic apparatus EA may be realized.

Figure 3A:
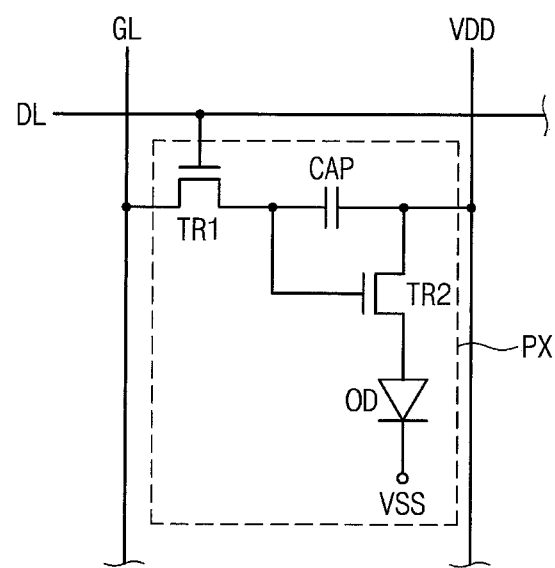
FIG. 3A is an equivalent circuit diagram schematically illustrating a component of FIG. 2A.
Figure 3B:
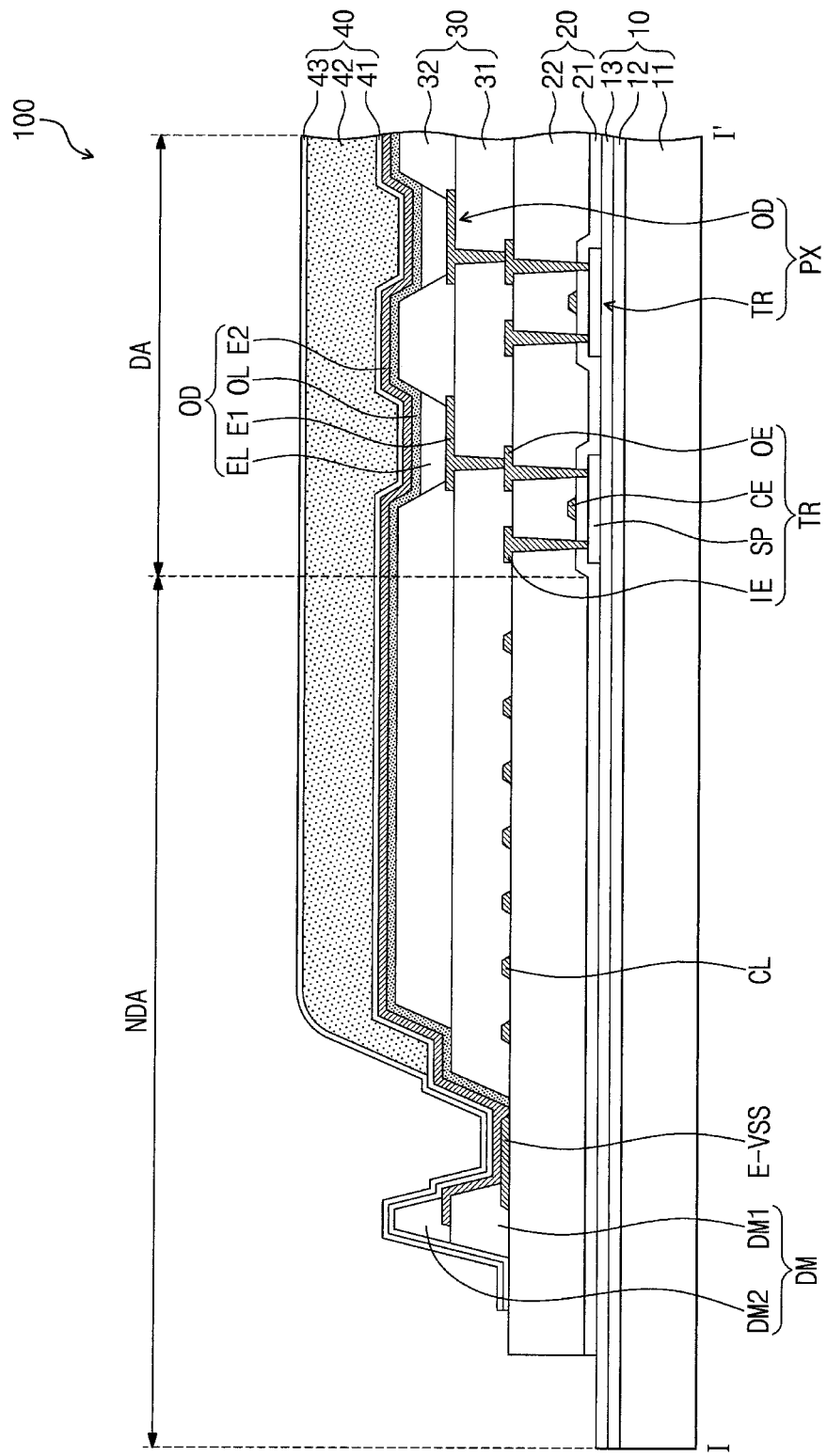
FIG. 3B is a cross-sectional view taken along a line I-I' of FIG. 2A.

FIG. 3A is an equivalent circuit diagram schematically illustrating a component of FIG. 2A. FIG. 3B is a cross-sectional view taken along a line I-I' of FIG. 2A. An equivalent circuit diagram of one pixel PX is illustrated in FIG. 3A for the purpose of ease and convenience of description and illustration. Hereinafter, an embodiment of the inventive concepts will be described with reference to FIGS. 3A and 3B.

The electronic panel 100 may comprise an insulating substrate 10, a pixel PX, a plurality of signal lines CL, a power source connection pattern E-VSS, a dam portion DM, and a plurality of insulating layers 20, 30 and 40. The insulating layers 20, 30 and 40 may comprise a circuit insulating layer 20, a display insulating layer 30, and an encapsulation layer 40.

The insulating substrate 10 may comprise a base layer 11, a first auxiliary layer 12, and a second auxiliary layer 13. The base layer 11 may comprise an insulating material. The base layer 11 may comprise a flexible material. For example, the base layer 11 may comprise polyimide (PI). However, embodiments of the inventive concepts are not limited thereto. In other embodiments, the base layer 11 may be formed of at least one of other various materials such as a rigid material, glass, and plastic.

The first auxiliary layer 12 and the second auxiliary layer 13 may be located on the base layer 11. The first auxiliary layer 12 and the second auxiliary layer 13 may fully cover the base layer 11.

The first auxiliary layer 12 may comprise a barrier layer. Thus, the first auxiliary layer 12 may prevent or reduce instances of oxygen or moisture permeating into the pixel PX through the base layer 11.

The second auxiliary layer 13 may comprise a buffer layer. Thus, the second auxiliary layer 13 may control surface energy of the insulating substrate 10 in such a way that the pixel PX is stably formed on the insulating substrate 10.

Meanwhile, a stacking order of the first and second auxiliary layers 12 and 13 may be changed in the insulating substrate 10, or one of the first and second auxiliary layers 12 and 13 may be omitted. Alternatively, in the insulating substrate 10, at least one of the base layer 11, the first auxiliary layer 12 or the second auxiliary layer 13 may be provided in plurality. For example, the first auxiliary layers 12 and the second auxiliary layers 13 may be alternately stacked on the base layer 11. However, embodiments of the inventive concepts are not limited thereto. The insulating substrate 10 may be variously modified.

The pixel PX may be located on the insulating substrate 10. The pixel PX may be located on the insulating substrate 10 in the display area DA, as described above. Referring to FIG. 3A, the pixel PX may be connected to a plurality of signal lines. In the present embodiment, a gate line GL, a data line DL and a power line VDD are illustrated as the signal lines. However, embodiments of the inventive concepts are not limited thereto. In another embodiment, the pixel PX may be additionally connected to at least one of other various signal lines.

The pixel PX may comprise a first thin film transistor TR1, a capacitor CAP, a second thin film transistor TR2, and a light emitting element OD. The first thin film transistor TR1 may be a switching element configured to control on/off of the pixel PX. The first thin film transistor TR1 may transmit or block a data signal provided through the data line DL in response to a gate signal provided through the gate line GL.

The capacitor CAP may be connected to the first thin film transistor TR1 and the power line VDD. The capacitor CAP may be charged with charges corresponding to a difference between the data signal transmitted from the first thin film transistor TR1 and a first power source voltage provided through the power line VDD.

The second thin film transistor TR2 may be connected to the first thin film transistor TR1, the capacitor CAP, and the light emitting element OD. The second thin film transistor TR2 may control a driving current, flowing through the light emitting element OD, in response to the amount of the charges stored in the capacitor CAP. A turn-on time of the second thin film transistor TR2 may be determined depending on the amount of the charges stored in the capacitor CAP. The second thin film transistor TR2 may provide the first power source voltage transmitted through the power line VDD to the light emitting element OD for the turn-on time.

The light emitting element OD may be connected to the second thin film transistor TR2 and a power source terminal VSS. The light emitting element OD may emit light by a voltage corresponding to a difference between a signal transmitted through the second thin film transistor TR2 and a second power source voltage received through the power source terminal VSS. The light emitting element OD may emit the light for the turn-on time of the second thin film transistor TR2.

The light emitting element OD may comprise a light emitting material. The light emitting element OD may generate light having a color based on the light emitting material. For example, the color of the light generated from the light emitting element OD may be a red color, a green color, a blue color, or a white color.

One thin film transistor TR and the light emitting element OD of the components of the pixel PX are illustrated as an example in FIG. 3B. The thin film transistor TR (hereinafter, referred to as 'a thin film element TR') may correspond to the second thin film transistor TR2 illustrated in FIG. 3A.

The thin film element TR may be located on the insulating substrate 10. The thin film element TR and the circuit insulating layer 20 may constitute a thin film element layer. The thin film element TR may comprise a semiconductor pattern SP, a control electrode CE, an input electrode IE, and an output electrode OE. The circuit insulating layer 20 may comprise a first insulating layer 21 and a second insulating layer 22 which are sequentially stacked on the insulating substrate 10.

The semiconductor pattern SP may be located on the insulating substrate 10. The semiconductor pattern SP may comprise a semiconductor material. The control electrode CE may be spaced apart from the semiconductor pattern SP with the first insulating layer 21 interposed therebetween. The control electrode CE may be connected to the first thin film transistor TR1 and one electrode of the capacitor CAP.

The input electrode IE and the output electrode OE may be spaced apart from the control electrode CE with the second insulating layer 22 interposed therebetween. The input electrode IE and the output electrode OE of the thin film element TR may penetrate the first and second insulating layers 21 and 22 so as to be connected to one side portion and another side portion of the semiconductor pattern SP, respectively.

In other embodiments, in the thin film element TR, the control electrode CE may be located under the semiconductor pattern SP, and/or the input electrode IE and the output electrode OE may be located under the semiconductor pattern SP or may be located on the same layer as the semiconductor pattern SP so as to be connected directly to the semiconductor pattern SP. The thin film element TR according to an embodiment of the inventive concepts may have any one of various structures and is not limited to a specific embodiment.

The light emitting element OD may be located on the circuit insulating layer 20. The light emitting element OD and the display insulating layer 30 may constitute a display element layer. The light emitting element OD may comprise a first electrode E1, an emission layer EL, a control layer OL, and a second electrode E2. The display insulating layer 30 may comprise a third insulating layer 31 and a fourth insulating layer 32 which are sequentially stacked.

The first electrode E1 may penetrate the third insulating layer 31 so as to be connected to the thin film element TR. Meanwhile, the electronic panel 100 may further comprise a connection electrode located between the first electrode E1 and the thin film element TR. In this case, the first electrode E1 may be electrically connected to the thin film element TR through the connection electrode.

The fourth insulating layer 32 may be located on the third insulating layer 31. An opening may be defined in the fourth insulating layer 32. The opening may expose at least a portion of the first electrode E1. The fourth insulating layer 32 may be a pixel defining layer.

The emission layer EL may be located in the opening and may be located on the first electrode E1 exposed by the opening. The emission layer EL may comprise a light emitting material. For example, the emission layer EL may comprise at least one of materials emitting red light, green light and blue light. In an embodiment, the emission layer EL may comprise a fluorescent material or a phosphorescent material. The emission layer EL may comprise an organic material and/or an inorganic material. The emission layer EL may emit light in response to a potential difference between the first electrode E1 and the second electrode E2.

The control layer OL may be located between the first electrode E1 and the second electrode E2. The control layer OL may be located adjacent to the emission layer EL. In the present embodiment, the control layer OL is located between the emission layer EL and the second electrode E2. However, embodiments of the inventive concepts are not limited thereto. In other embodiments, the control layer OL may be located between the emission layer EL and the first electrode E1, or the control layer OL may comprise a plurality of layers stacked in the third direction DR3 with the emission layer EL interposed therebetween.

The control layer OL may have a single unitary body shape extending from the display area DA into the peripheral area NDA. The control layer OL may be provided in common in a plurality of the pixels.

The second electrode E2 may be located on the emission layer EL. The second electrode E2 may have a single unitary body shape extending from the display area DA into the peripheral area NDA. The second electrode E2 may be provided in common in the plurality of pixels.

The second electrode E2 may be opposite to the first electrode E1. The second electrode E2 may be connected to the power source terminal VSS of FIG. 2A. The light emitting element OD may receive the second power source voltage through the second electrode E2.

The second electrode E2 may comprise a transparent conductive material or a semi-transparent conductive material. Thus, light generated from the emission layer EL may easily exit in the third direction DR3 through the second electrode E2. However, embodiments of the inventive concepts are not limited thereto. In another embodiment, the first electrode E1 may comprise a transparent or semi-transparent conductive material, and the light emitting element OD may be driven in a rear surface light emitting type. In still another embodiment, the light emitting element OD may be driven in a both surface light emitting type in which light exits through a front surface and a rear surface.

The encapsulation layer 40 may be located on the light emitting element OD to encapsulate the light emitting element OD. The encapsulation layer 40 may have a single unitary body shape extending from the display area DA into the peripheral area NDA. The encapsulation layer 40 may be provided in common in the plurality of pixels. A capping layer covering the second electrode E2 may be located between the second electrode E2 and the encapsulation layer 40.

The encapsulation layer 40 may comprise a first inorganic layer 41, an organic layer 42 and a second inorganic layer 43, which are sequentially stacked in the third direction DR3. However, embodiments of the inventive concepts are not limited thereto. In another embodiment, the encapsulation layer 40 may further comprise a plurality of inorganic layers and/or organic layers.

The first inorganic layer 41 may cover the second electrode E2. The first inorganic layer 41 may prevent or reduce instances of external moisture and/or oxygen permeating into the light emitting element OD. For example, the first inorganic layer 41 may comprise silicon nitride, silicon oxide, silicon oxynitride, or a combination thereof. The first inorganic layer 41 may be formed by a deposition process.

The organic layer 42 may be located on the first inorganic layer 41 and may be in contact with the first inorganic layer 41. The organic layer 42 may provide a flat surface on the first inorganic layer 41. The organic layer 42 may cover a bent portion of a top surface of the first inorganic layer 41 and/or a particle existing on the first inorganic layer 41, and thus it is possible to block the influence of the state of the top surface of the first inorganic layer 41 on components formed on the organic layer 42. In addition, the organic layer 42 may relax or release stress between layers being in contact with the organic layer 42. The organic layer 42 may comprise an organic material and may be formed by a solution process such as a spin coating process, a slit coating process, and/or an inkjet process.

The second inorganic layer 43 may be located on the organic layer 42 to cover the organic layer 42. The second inorganic layer 43 may be stably formed on the top surface of the organic layer 42, which is relatively flat as compared with the top surface of the first inorganic layer 41. The second inorganic layer 43 may encapsulate moisture outputted from the organic layer 42 to prevent or reduce instances of the moisture being provided to the outside. For example, the second inorganic layer 43 may comprise silicon nitride, silicon oxide, silicon oxynitride, or a combination thereof. The second inorganic layer 43 may be formed by a deposition process.

Meanwhile, the input sensing unit ISU (see FIG. 2B) comprising a plurality of sensor patterns may be located on the encapsulation layer 40. The sensor patterns of the input sensing unit ISU may be formed directly on the encapsulation layer 40 by deposition and patterning processes. Alternatively, the input sensing unit ISU may be formed separately and then may be coupled to the encapsulation layer 40. However, embodiments of the inventive concepts are not limited thereto. One of other various kinds of display panels may be applied to the electronic panel 100 according to the embodiments of the inventive concepts.

Meanwhile, the driving signal line CL, the dam portion DM and the power source connection pattern E-VSS may be located in the peripheral area NDA. The driving signal line CL may be provided in plurality and may be located on the circuit insulating layer 20. The driving signal line CL may be a routing line connected to a pad or may be an interconnection line for forming an integrated circuit (IC). For example, the driving signal line CL may comprise a power supply line, an initialization voltage line, or an emission control line.

The power source connection pattern E-VSS may supply the second power source voltage to the light emitting element OD. The power source connection pattern E-VSS may correspond to the power source terminal VSS of the pixel PX. The second electrode E2 may extend into the peripheral area NDA so as to be connected to the power source connection pattern E-VSS. In the present embodiment, the second power source voltage supplied to the pixel PX may be a common voltage supplied to all of the pixels PX.

The dam portion DM may be located to cover a portion of the power source connection pattern E-VSS. In the present embodiment, the dam portion DM may have a double-layered structure comprising a first dam DM1 and a second dam DM2.

The first dam DM1 may comprise the same material as the third insulating layer 31. The first dam DM1 may be formed simultaneously with the third insulating layer 31 and may be located on the same layer as the third insulating layer 31.

The second dam DM2 may be stacked on the first dam DM1. In the present embodiment, a portion of the second electrode E2 may be located between the first dam DM1 and the second dam DM2. In other words, the second dam DM2 according to the present embodiment may be formed by a separate process after the formation of the second electrode E2. In an embodiment, the second dam DM2 may be formed simultaneously with the fourth insulating layer 32. Alternatively, the dam portion DM may have a single-layered structure.

The dam portion DM may be located adjacent to at least one side of the display area DA. In an embodiment, the dam portion DM may surround the display area DA when viewed in a plan view. The dam portion DM may define an area in which a liquid organic material is spread in a process of forming the organic layer 42. The organic layer 42 may be formed by an inkjet method of applying the liquid organic material on the first inorganic layer 41. At this time, the dam portion DM may set a boundary of an area, in which the liquid organic material is located, and may prevent or reduce instances of the liquid organic material overflowing to the outside of the dam portion DM.

The first inorganic layer 41 and the second inorganic layer 43 may extend from the display area DA to the outside of the dam portion DM. Thus, the dam portion DM may be covered by the first and second inorganic layers 41 and 43. The organic layer 42 may be located inside the dam portion DM. However, embodiments of the inventive concepts are not limited thereto. In another embodiment, the organic layer 42 may extend to an area overlapping with the dam portion DM.

Figure 4A:
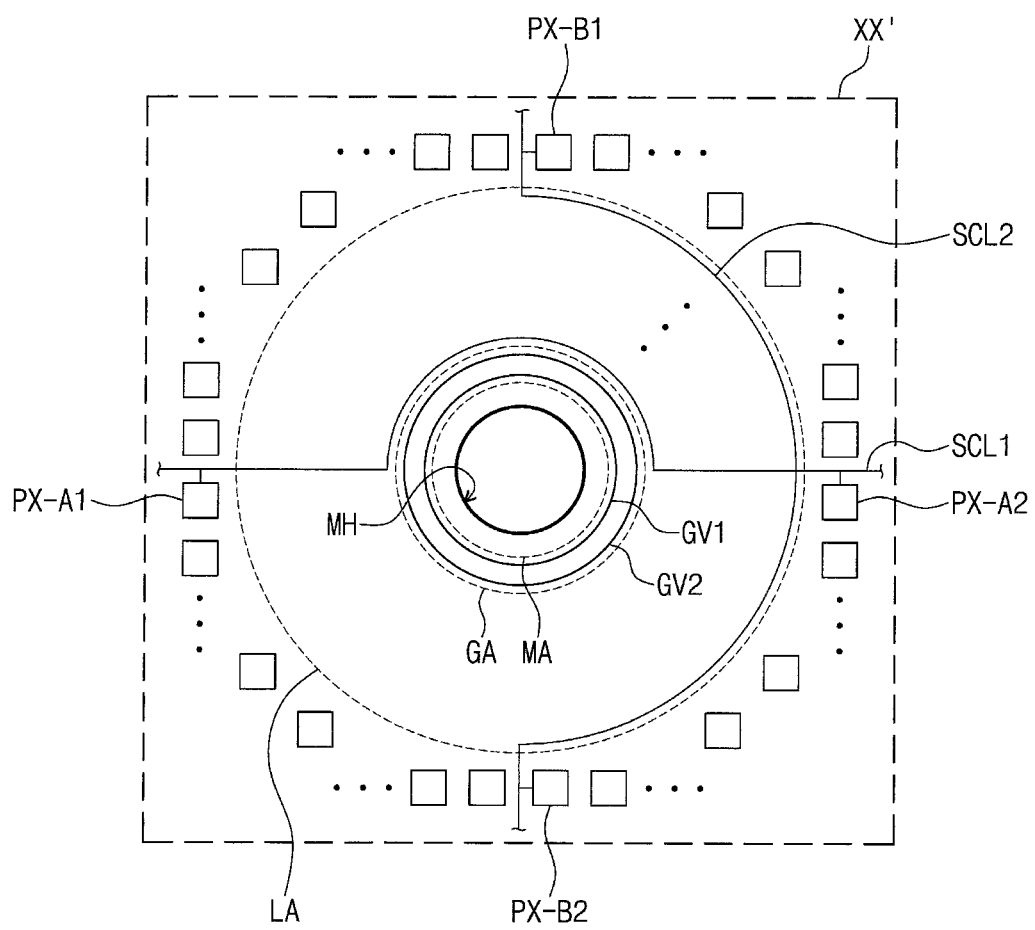
FIG. 4A is a plan view illustrating an area XX' of FIG. 2A.
Figure 4B:
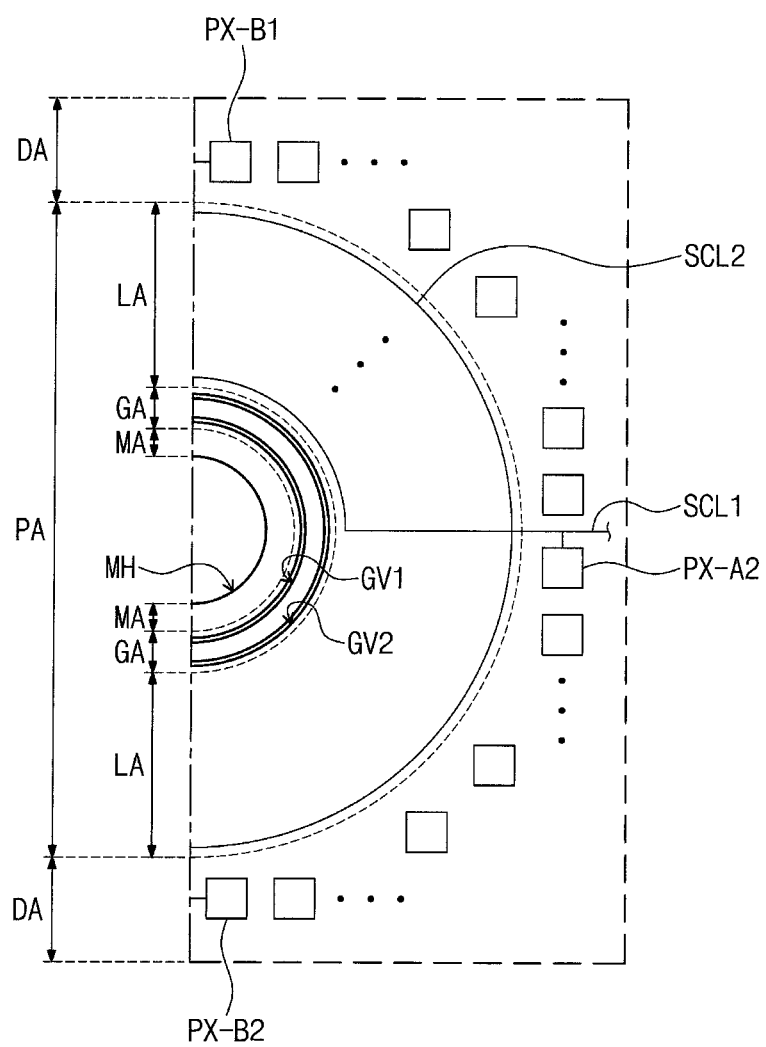
FIG. 4B is a plan view illustrating a portion of FIG. 4A.
Figure 4C:
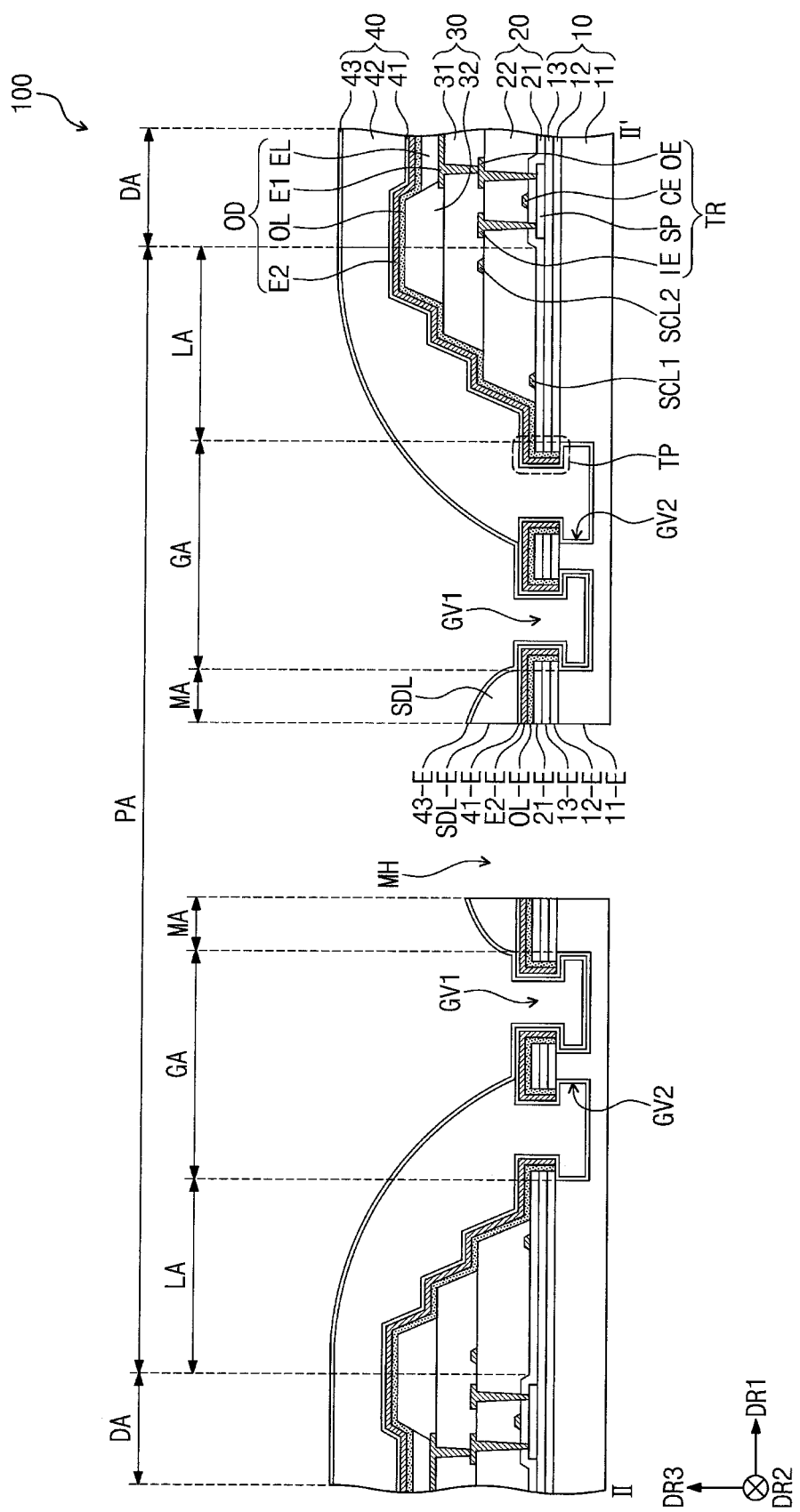
FIG. 4C is a cross-sectional view taken along a line II-II' of FIG. 2A.

FIG. 4A is a plan view illustrating an area XX' of FIG. 2A, and FIG. 4B is a plan view illustrating a portion of FIG. 4A. FIG. 4C is a cross-sectional view taken along a line II-II' of FIG. 2A. FIG. 4B illustrates an area corresponding to a right half of FIG. 4A. For the purpose of ease and convenience of description and illustration, some components are omitted in FIGS. 4A and 4B, and a reduced area and/or an enlarged area is illustrated in FIG. 4C. Hereinafter, an embodiment of the inventive concepts will be described with reference to FIGS. 4A to 4C. Meanwhile, the same components as described with reference to FIGS. 1 to 3B will be indicated by the same reference numerals or designators, and the descriptions thereto will be omitted for the purpose of ease and convenience of description.

The hole area PA may be surrounded by the display area DA when viewed in a plan view. The hole area PA may comprise a margin area MA, a groove area GA, and a line area LA. The line area LA, the groove area GA and the margin area MA may surround the module hole MH in a plan view and may be sequentially arranged in a direction from the display area DA toward the module hole MH. The electronic panel 100 according to the present embodiment may comprise signal lines SCL1 and SCL2, a plurality of recess patterns GV1 and GV2 and a protective pattern SDL, which are located in the hole area PA.

The signal lines SCL1 and SCL2 may be connected to pixels PX-A1, PX-A2, PX-B1 and PX-B2 via the line area LA. In the present embodiment, two signal lines SCL1 and SCL2 and four pixels PX-A1, PX-A2, PX-B1 and PX-B2 connected thereto are illustrated as an example for the purpose of ease and convenience of description. Hereinafter, the two signal lines SCL1 and SCL2 will be referred to as a first signal line SCL1 and a second signal line SCL2, and the four pixels PX-A1, PX-A2, PX-B1 and PX-B2 will be referred to as first to fourth pixels PX-A1, PX-A2, PX-B1 and PX-B2.

The first signal line SCL1 may be connected to the first pixel PX-A1 and the second pixel PX-A2 which are spaced apart from each other with the hole area PA interposed therebetween. The first pixel PX-A1 and the second pixel PX-A2 may constitute the same row. The first signal line SCL1 connected to the first pixel PX-A1 may be connected to the second pixel PX-A2 via the line area LA of the hole area PA.

Since the first pixel PX-A1 and the second pixel PX-A2 are electrically connected to each other through the first signal line SCL1, the first and second pixels PX-A1 and PX-A2 may be provided with the same electrical signal. For example, the first signal line SCL1 may correspond to the gate line GL illustrated in FIG. 3A. Thus, the first and second pixels PX-A1 and PX-A2 spaced apart from each other with the module hole MH interposed therebetween may be turned on/off by substantially the same gate signal.

The second signal line SCL2 may be connected to the third pixel PX-B1 and the fourth pixel PX-B2 which are spaced apart from each other with the hole area PA interposed therebetween. The third pixel PX-B1 and the fourth pixel PX-B2 may constitute the same column. The second signal line SCL2 connected to the third pixel PX-B1 may be connected to the fourth pixel PX-B2 via the line area LA of the hole area PA.

Since the third pixel PX-B1 and the fourth pixel PX-B2 are electrically connected to each other through the second signal line SCL2, the third and fourth pixels PX-B1 and PX-B2 may be provided with the same electrical signal. For example, the second signal line SCL2 may correspond to the data line DL illustrated in FIG. 3A. Thus, the third and fourth pixels PX-B1 and PX-B2 spaced apart from each other with the module hole MH interposed therebetween may be provided with substantially the same data signal.

In the present embodiment, the first and second signal lines SCL1 and SCL2 may be patterns located in only the line area LA. In this case, the first and second signal lines SCL1 and SCL2 may function as bridge patterns which connect signal lines respectively connected to the pixels PX-A1, PX-A2, PX-B1 and PX-B2. However, embodiments of the inventive concepts are not limited thereto. According to the embodiment of the inventive concepts, the electronic panel 100 may comprise the plurality of signal lines located in the line area LA, and thus it is possible to easily connect the pixels spaced apart from each other with the module hole MH interposed therebetween. As a result, it may be easy to electrically control the pixels spaced apart from each other with the module hole MH interposed therebetween.

The plurality of recess patterns GV1 and GV2 may be located in the groove area GA. The recess patterns GV1 and GV2 may be recessed from the top surface of the electronic panel 100 by removing a portion of the components of the electronic panel 100. The recess patterns GV1 and GV2 do not penetrate the electronic panel 100, unlike the module hole MH. Thus, the recess patterns GV1 and GV2 may not open at least a rear surface of the insulating substrate 10.

Each of the recess patterns GV1 and GV2 may penetrate some components while leaving a portion of the base layer 11. In the present embodiment, a region (e.g., an initial recess pattern) may be formed to penetrate the first insulating layer 21, the second auxiliary layer 13, the first auxiliary layer 12, and a portion of the base layer 11, and the first inorganic layer 41 may be formed to cover an inner surface of the region, thereby forming each of the recess patterns GV1 and GV2. Thus, the first inorganic layer 41 may extend into the hole area PA to define inner surfaces of the recess patterns GV1 and GV2.

Meanwhile, in the present embodiment, the control layer OL and the second electrode E2 may be formed after removing portions of the first insulating layer 21 and the first and second auxiliary layers 12 and 13 for forming the recess patterns GV1 and GV2. The control layer OL and the second electrode E2 may be formed by deposition processes or evaporation processes. The control layer OL and the second electrode E2 may cover sidewalls of the first auxiliary layer 12, the second auxiliary layer 13 and the first insulating layer 21, which are comprised in a sidewall of the region for each of the recess patterns GV1 and GV2. Thereafter, the control layer OL and the second electrode E2 may be covered by the first inorganic layer 41.

In the present embodiment, an undercut may be formed between the base layer 11 and the first auxiliary layer 12 when the region for each of the recess patterns GV1 and GV2 is formed to penetrate the first insulating layer 21, the second auxiliary layer 13, the first auxiliary layer 12, and a portion of the base layer 11. Thus, the first and second auxiliary layers 12 and 13 and the first insulating layer 21 may laterally protrude from the base layer 11 in the region. The first inorganic layer 41 may continuously cover the protrusions of the layers 12, 13 and 21.

Thus, each of the recess patterns GV1 and GV2 may have an undercut shape defined under a tip portion TP laterally protruding toward a center of each of the recess patterns GV1 and GV2. However, embodiments of the inventive concepts are not limited to the shapes of the recess patterns GV1 and GV2. In certain embodiments, each of the recess patterns GV1 and GV2 may have one of other various layer structures having the tip portions TP.

The recess patterns GV1 and GV2 may comprise a first recess pattern GV1 and a second recess pattern GV2, which are spaced apart from each other. The first and second recess patterns GV1 and GV2 may be selectively filled with the organic material. For example, the first and second recess patterns GV1 and GV2 may be selectively filled with the organic layer 42. For example, the first recess pattern GV1 may be exposed from the organic layer 42, and the second recess pattern GV2 may be filled with the organic layer 42. The second recess pattern GV2 may be overlapped with the organic layer 42.

The organic layer 42 may extend from the display area DA into the hole area PA. Here, the organic layer 42 may extend into an area, in which the second recess pattern GV2 is located, to fill the second recess pattern GV2. Thus, the organic layer 42 may be in contact with the inner surface of the second recess pattern GV2, which is defined by the first inorganic layer 41.

Since the organic layer 42 fills the second recess pattern GV2, the tip portion TP of the second recess pattern GV2 may be supported by the organic layer 42. Thus, it is possible to prevent or reduce instances of the tip portion TP being damaged by its protruding shape. As a result, durability of the electronic panel 100 may be improved.

On the contrary, the first recess pattern GV1 may not be filled with the organic layer 42. Thus, a portion of the first inorganic layer 41, which defines the inner surface of the first recess pattern GV1, may not be in contact with the organic layer 42 but may be exposed to air. According to the embodiment of the inventive concepts, at least one of the recess patterns GV1 and GV2 may be exposed from the organic layer 42, and thus continuity of the organic layer 42 in the hole area PA may be blocked or cut. As a result, it is possible to prevent or reduce instances of an external contaminant, provided to the hole area PA, permeating into the display area DA through the organic layer 42.

The protective pattern SDL may be located in the hole area PA. In the present embodiment, the protective pattern SDL may be located in the margin area MA. In the present embodiment, the margin area MA may be covered by the protective pattern SDL. The protective pattern SDL may have a shape which surrounds the module hole MH when viewed in a plan view.

The margin area MA may be closest to the module hole MH. The groove area GA may be spaced apart from the module hole MH with the margin area MA interposed therebetween. Thus, influence on the groove area GA may be minimized in a process of forming the module hole MH. However, embodiments of the inventive concepts are not limited thereto. In another embodiment, the margin area MA may be omitted in the electronic panel 100.

The protective pattern SDL may absorb light having a predetermined wavelength. For example, the protective pattern SDL may comprise a material that has a high absorption rate for light having a laser wavelength band. Thus, the protective pattern SDL may inhibit laser light, irradiated in the process of forming the module hole MH, from affecting the electronic panel 100. As a result, damage of the electronic panel 100 may be prevented or reduced when the module hole MH is formed.

In an embodiment, the protective pattern SDL may comprise the same material as the organic layer 42. In a case in which the organic layer 42 comprises a material capable of absorbing the laser light, the organic layer 42 and the protective pattern SDL may be formed of the same material, and thus manufacturing processes may be simplified and a process cost may be reduced. However, embodiments of the inventive concepts are not limited thereto. In certain embodiments, the protective pattern SDL may comprise at least one of other various materials capable of absorbing the laser light.

The module hole MH may be located in the hole area PA and may be spaced apart from the pixels. The module hole MH may be defined in a central portion of the hole area PA. The module hole MH may penetrate the electronic panel 100. The module hole MH may penetrate components, located in the hole area PA, of the components of the electronic panel 100. At this time, the module hole MH may also penetrate the protective pattern SDL.

For example, the module hole MH may penetrate the base layer 11, the first auxiliary layer 12, the second auxiliary layer 13, the first insulating layer 21, the control layer OL, the second electrode E2, the first inorganic layer 41, the protective pattern SDL, and the second inorganic layer 43. Thus, an inner surface of the module hole MH may be defined by a sidewall 11-E (e.g., a cut end) of the base layer, a sidewall 12-E of the first auxiliary layer, a sidewall 13-E of the second auxiliary layer, a sidewall 21-E of the first insulating layer, a sidewall OL-E of the control layer, a sidewall E2-E of the second electrode, a sidewall 41-E of the first inorganic layer, a sidewall SDL-E of the protective pattern, and a sidewall 43-E of the second inorganic layer.

According to the embodiment of the inventive concepts, the protective pattern SDL may have the sidewall SDL-E exposed by the module hole MH. When the protective pattern SDL comprises an organic material, the sidewall SDL-E of the protective pattern may act as a path to which an external contaminant may permeate. However, according to the embodiment of the inventive concepts, the first recess pattern GV1 between the protective pattern SDL and the organic layer 42 may be exposed from the protective pattern SDL and/or the organic layer 42, and thus the protective pattern SDL may be separated from the organic layer 42. As a result, a movement path of an external contaminant may be easily blocked.

Figure 5A:
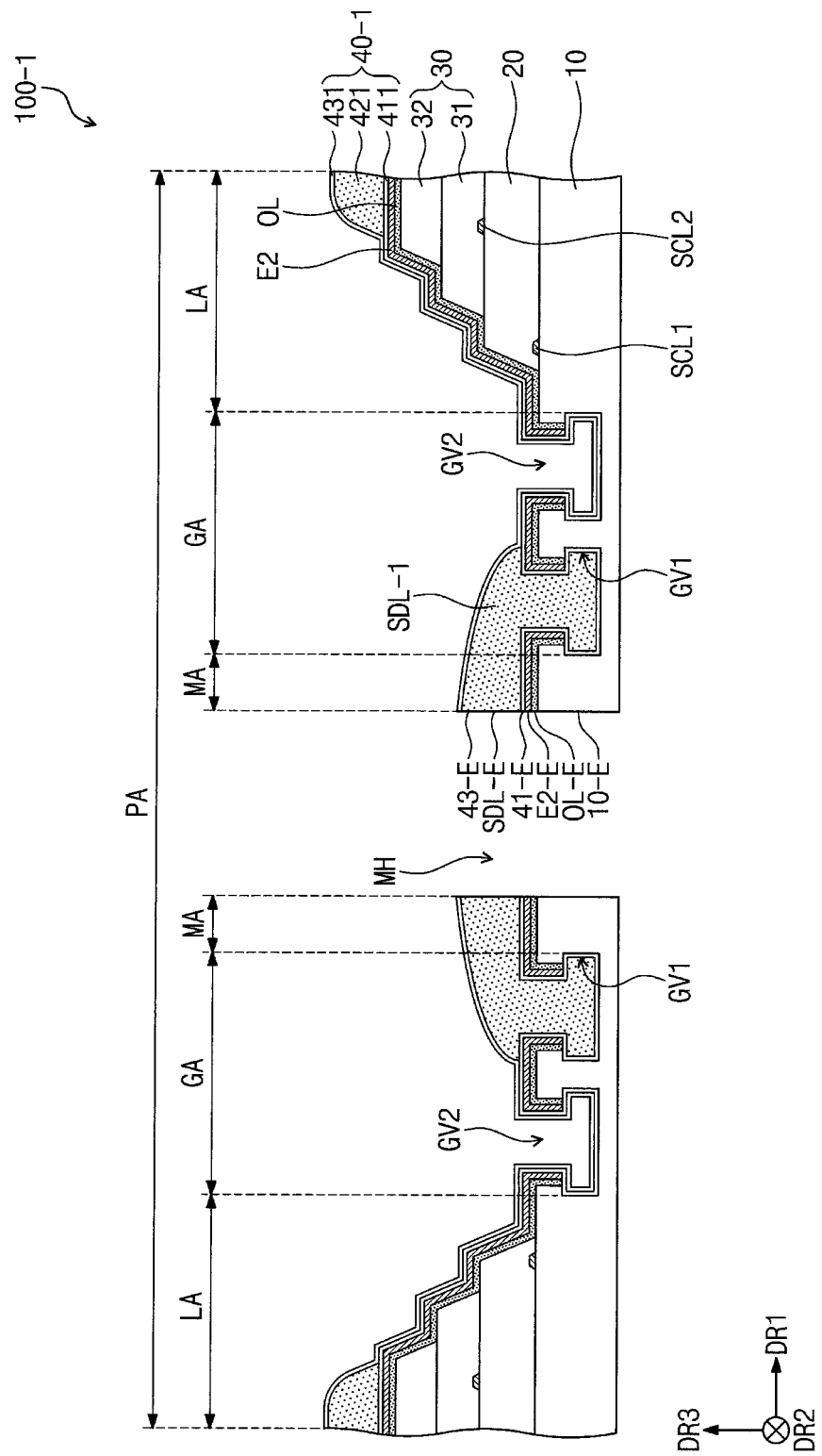
FIG. 5A is a cross-sectional view illustrating a portion of an electronic panel according to some example embodiments.
Figure 5B:
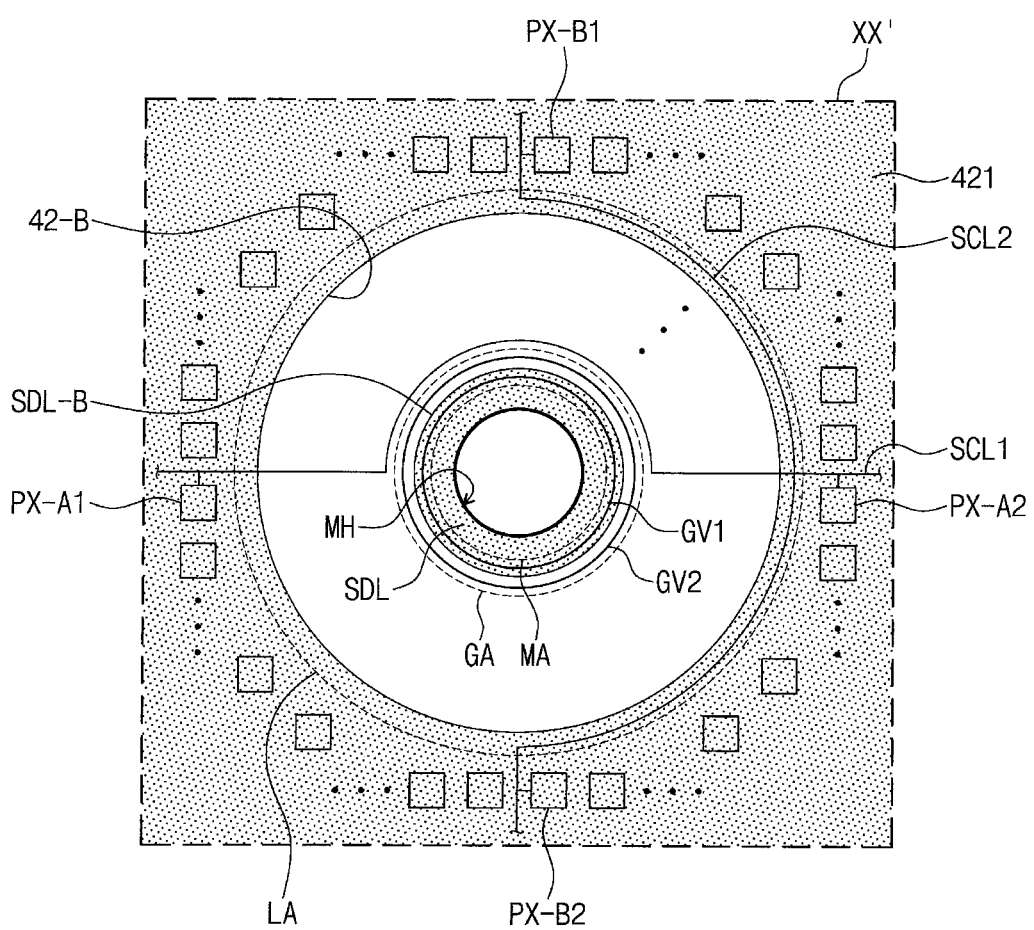
FIG. 5B is a plan view illustrating a portion of an electronic panel according to some example embodiments.

FIG. 5A is a cross-sectional view illustrating a portion of an electronic panel according to an embodiment of the inventive concepts, and FIG. 5B is a plan view illustrating a portion of an electronic panel according to an embodiment of the inventive concepts. A hole area PA of an electronic panel 100-1 is schematically illustrated in FIG. 5A, and some components are omitted in FIG. 5A as compared with FIG. 4C. FIG. 5B illustrates an area of the electronic panel 100-1, which corresponds to FIG. 4A. Hereinafter, an embodiment of the inventive concepts will be described with reference to FIGS. 5A and 5B. In the present embodiment, the same components as described with reference to FIGS. 1 to 4C will be indicated by the same reference numerals or designators, and the descriptions thereto will be omitted for the purpose of ease and convenience of description.

Some components are omitted in FIG. 5A for the purpose of ease and convenience of description and illumination. As illustrated in FIG. 5A, an encapsulation layer 40-1 may comprise a first inorganic layer 411, an organic layer 421, and a second inorganic layer 431. The organic layer 421 may not extend to the groove area GA. Thus, the organic layer 421 may be spaced apart from the recess patterns GV1 and GV2 when viewed in a plan view.

A protective pattern SDL-1 may extend from the margin area MA to cover at least a portion of the groove area GA. In the present embodiment, the protective pattern SDL-1 may selectively fill the recess patterns GV1 and GV2. For example, the first recess pattern GV1 may be filled with the protective pattern SDL-1. Thus, the tip portion of the first recess pattern GV1 may be supported by the protective pattern SDL-1, and the undercut shape of the first recess pattern GV1 may be stably maintained.

On the contrary, the second recess pattern GV2 may be exposed from the protective pattern SDL-1. The second recess pattern GV2 may be spaced apart from the protective pattern SDL-1 and the organic layer 421. Referring to FIG. 5B, a boundary SDL-B of the protective pattern SDL-1 covering the first recess pattern GV1 may be spaced apart from a boundary 42-B of the organic layer 421 covering the pixels PX-A1, PX-A2, PX-B1 and PX-B2 with the second recess pattern GV2 interposed between the boundaries SDL-B and 42-B.

Since the second recess pattern GV2 is not filled with the organic layer 421 and the protective pattern SDL-1, the organic layer 421 may not be connected to the protective pattern SDL-1. In other words, the second recess pattern GV2 may block connection of the organic layer 421 and the protective pattern SDL-1. Thus, it is possible to prevent or reduce instances of an external contaminant, provided through an exposed sidewall of the protective pattern SDL-1, permeating into the display area DA through the organic layer 421.

Figure 6A:
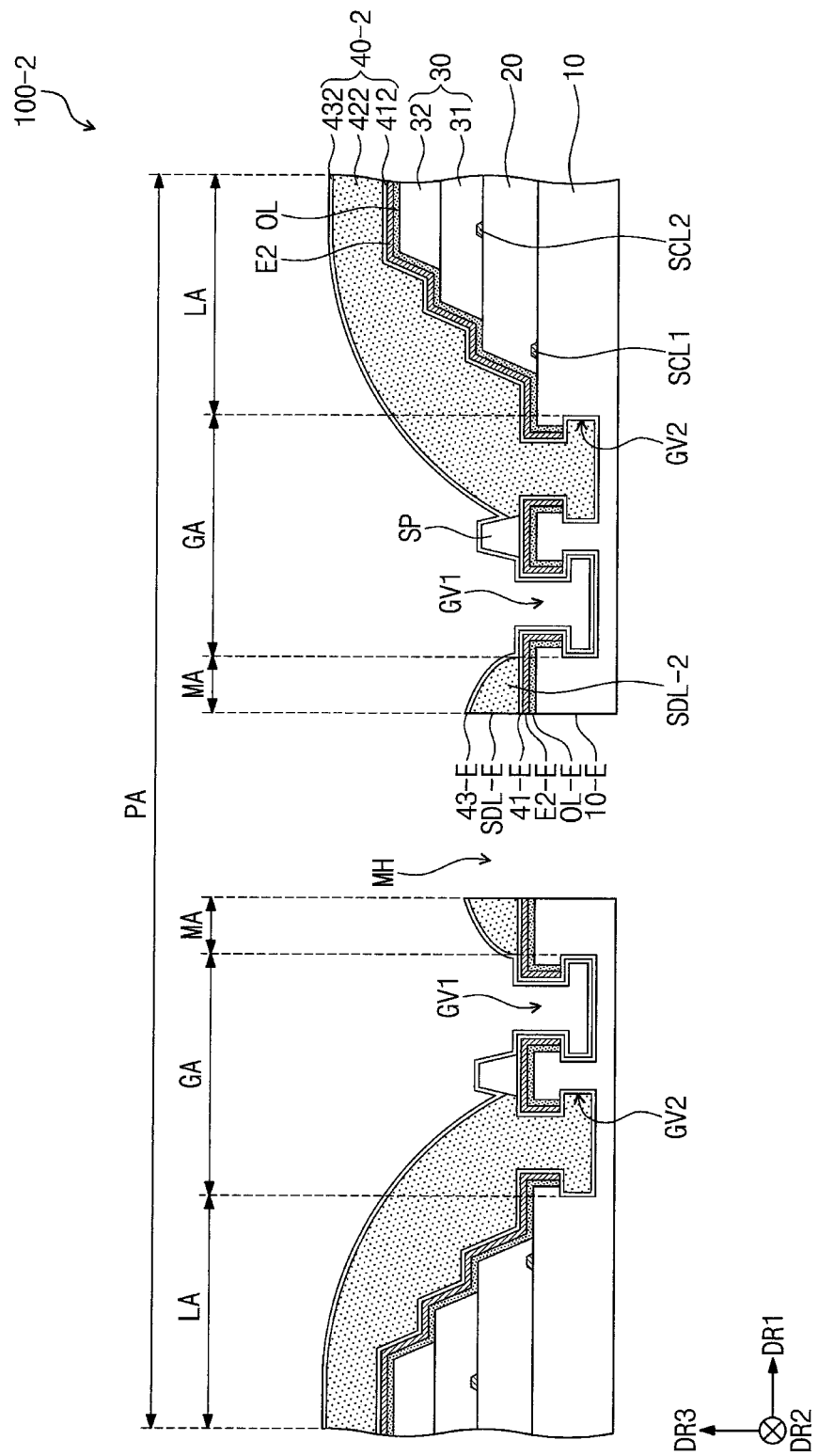
FIG. 6A is a cross-sectional view illustrating a portion of an electronic panel according to some example embodiments.
Figure 6B:
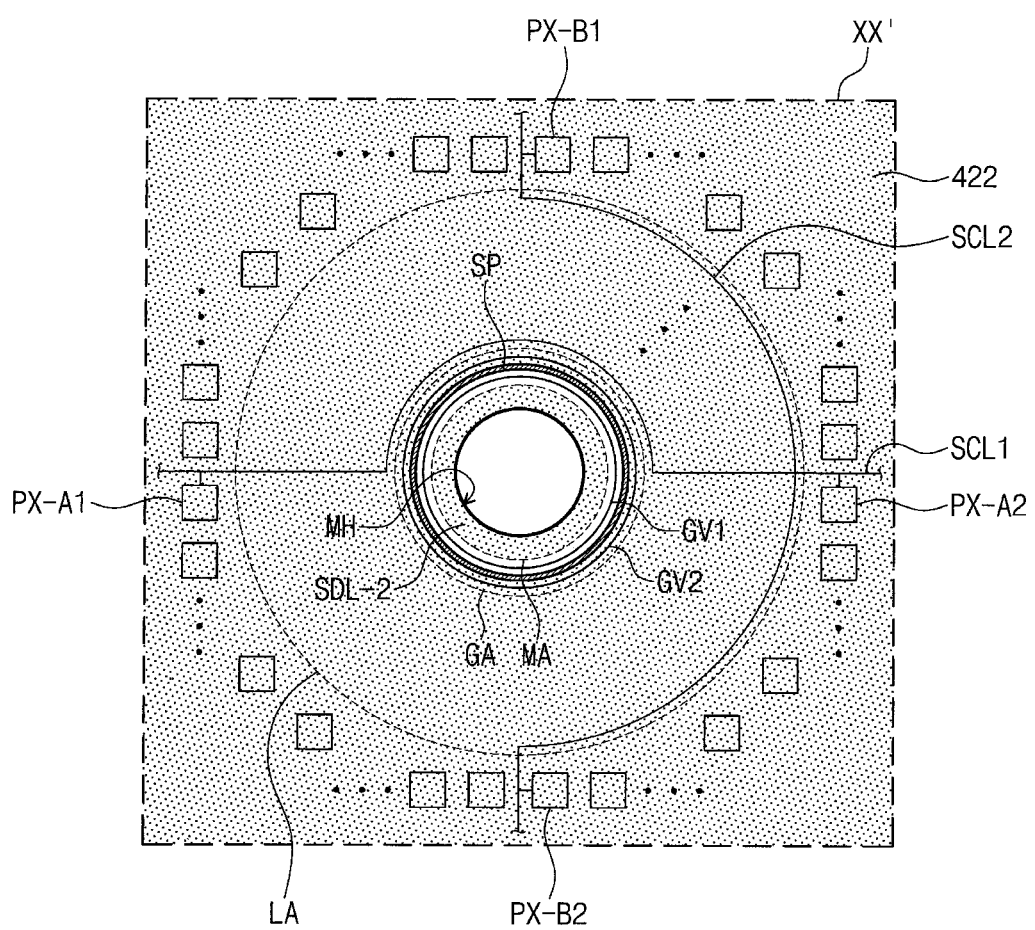
FIG. 6B is a plan view illustrating a portion of an electronic panel according to some example embodiments.

FIG. 6A is a cross-sectional view illustrating a portion of an electronic panel according to an embodiment of the inventive concepts, and FIG. 6B is a plan view illustrating a portion of an electronic panel according to an embodiment of the inventive concepts. FIG. 6A schematically illustrates a hole area PA of an electronic panel 100-2, and FIG. 6B illustrates an area of the electronic panel 100-2 which corresponds to FIG. 4A. Hereinafter, an embodiment of the inventive concepts will be described with reference to FIGS. 6A and 6B. In the present embodiment, the same components as described with reference to FIGS. 1 to 5B will be indicated by the same reference numerals or designators, and the descriptions thereto will be omitted for the purpose of ease and convenience of description.

The electronic panel 100-2 may further comprise a partition SP. The partition SP may be located in the groove area GA. The partition SP may be located between the first recess pattern GV1 and the second recess pattern GV2. The partition SP may have a shape which surrounds the module hole MH when viewed in a plan view.

The recess patterns GV1 and GV2 may be selectively filled with an organic material. For example, the recess patterns GV1 and GV2 may be selectively filled with a protective pattern SDL-2 or an organic layer 422. For example, the first recess pattern GV1 may not overlap with the protective pattern SDL-2 and the organic layer 422. The first recess pattern GV1 may not be filled with the protective pattern SDL-2 and the organic layer 422. The first recess pattern GV1 may be spaced apart from the protective pattern SDL-2 and the organic layer 422 when viewed in a plan view.

The second recess pattern GV2 may be filled with the protective pattern SDL-2 or the organic layer 422. In an embodiment, the second recess pattern GV2 may be filled with the organic layer 422. The organic layer 422 may extend from the display area DA into the groove area GA via the line area LA and may overlap with the second recess pattern GV2.

In the present embodiment, the organic layer 422 may be in contact with the partition SP. The partition SP may prevent or reduce instances of the organic layer 422 extending toward the first recess pattern GV1. Since the electronic panel 100-2 according to the present embodiment further comprises the partition SP, the organic layer 422 may selectively fill the second recess pattern GV2 among the first and second recess patterns GV1 and GV2. In addition, an area occupied by the organic layer 422 in a plan view may be easily controlled by the partition SP. The organic layer 422 and first and second inorganic layers 412 and 432 located under and on the organic layer 422 may constitute an encapsulation layer 40-2.

Figure 7A:
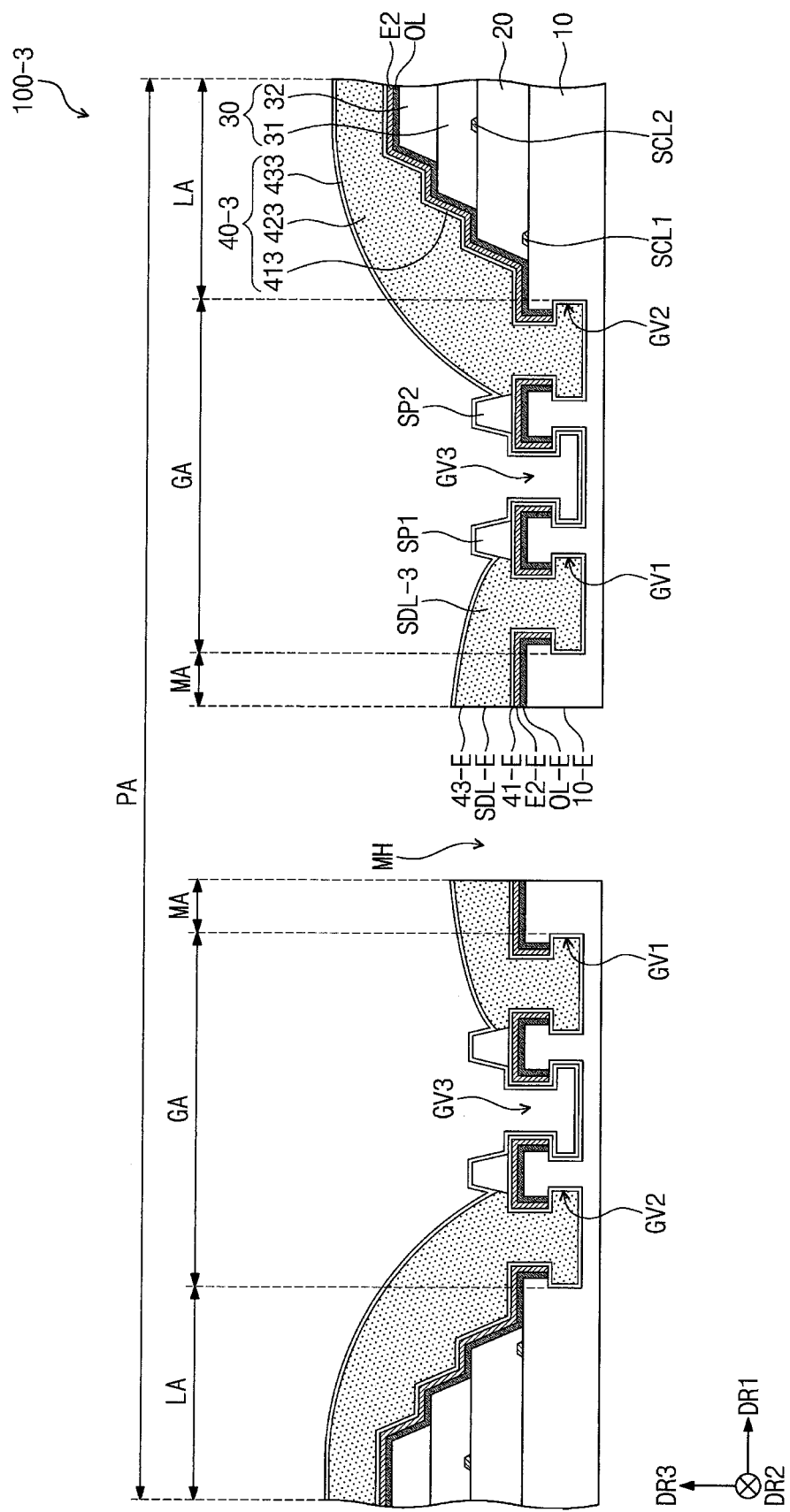
FIG. 7A is a cross-sectional view illustrating a portion of an electronic panel according to some example embodiments.
Figure 7B:
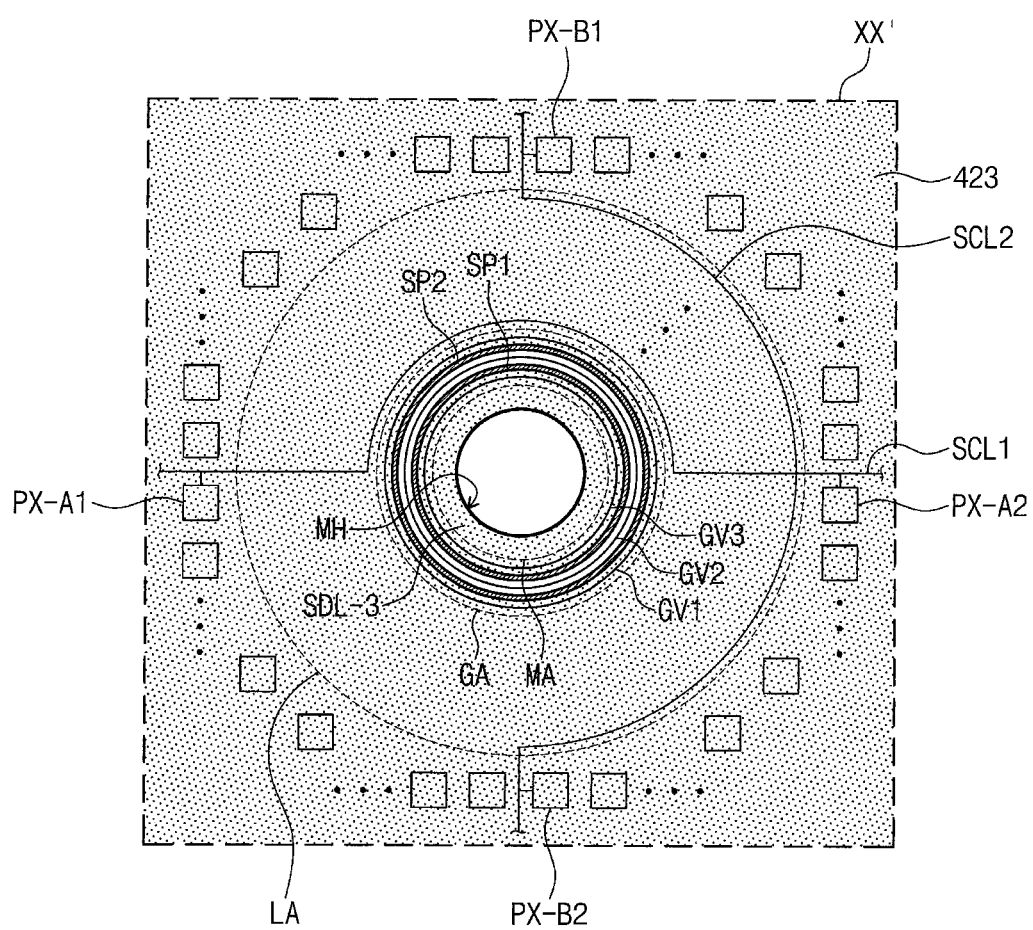
FIG. 7B is a plan view illustrating a portion of an electronic panel according to some example embodiments.

FIG. 7A is a cross-sectional view illustrating a portion of an electronic panel according to an embodiment of the inventive concepts, and FIG. 7B is a plan view illustrating a portion of an electronic panel according to an embodiment of the inventive concepts. FIG. 7A schematically illustrates a hole area PA of an electronic panel 100-3, and FIG. 7B illustrates an area of the electronic panel 100-3 which corresponds to FIG. 4A. Hereinafter, an embodiment of the inventive concepts will be described with reference to FIGS. 7A and 7B. In the present embodiment, the same components as described with reference to FIGS. 1 to 6B will be indicated by the same reference numerals or designators, and the descriptions thereto will be omitted for the purpose of ease and convenience of description.

The electronic panel 100-3 may comprise a plurality of recess patterns GV1, GV2 and GV3 and a plurality of partitions SP1 and SP2. The recess patterns GV1, GV2 and GV3 may comprise a first recess pattern GV1, a second recess pattern GV2 and a third recess pattern GV3, which are spaced apart from each other. The partitions SP1 and SP2 may comprise a first partition SP1 and a second partition SP2, which are spaced apart from each other.

Each of the first to third recess patterns GV1, GV2 and GV3 and the first and second partitions SP1 and SP2 may surround the module hole MH when viewed in a plan view. The first to third recess patterns GV1, GV2 and GV3 and the first and second partitions SP1 and SP2 may be alternately arranged when viewed in a plan view. In the present embodiment, the third recess pattern GV3 may be located between the first recess pattern GV1 and the second recess pattern GV2. The first partition SP1 may be located between the first recess pattern GV1 and the third recess pattern GV3 in a plan view, and the second partition SP2 may be located between the third recess pattern GV3 and the second recess pattern GV2.

In the present embodiment, an encapsulation layer 40-3 may comprise a first inorganic layer 413, an organic layer 423, and a second inorganic layer 433. The first inorganic layer 413 may define inner surfaces of the first and second recess patterns GV1 and GV2.

The organic layer 423 may extend from the display area DA to fill the second recess pattern GV2. In other words, the second recess pattern GV2 may be covered by the organic layer 423. The inner surface of the second recess pattern GV2 may be in contact with the organic layer 423.

The organic layer 423 may be in contact with the second partition SP2. The second partition SP2 may prevent or reduce instances of the organic layer 423 extending from the second recess pattern GV2 toward the module hole MH. The organic layer 423 may be spaced apart from the third recess pattern GV3 by the second partition SP2 when viewed in a plan view.

A protective pattern SDL-3 may cover the margin area MA and may extend from the margin area MA to fill the first recess pattern GV1. In other words, the first recess pattern GV1 may be covered by the protective pattern SDL-3. The inner surface of the first recess pattern GV1 may be in contact with the protective pattern SDL-3.

The protective pattern SDL-3 may be in contact with the first partition SP1. The first partition SP1 may prevent or reduce instances of the protective pattern SDL-3 extending from the first recess pattern GV1 toward the organic layer 423. The protective pattern SDL-3 may be spaced apart from the third recess pattern GV3 by the first partition SP1 when viewed in a plan view.

The second inorganic layer 433 may cover the organic layer 423, the first and second partitions SP1 and SP2 and the protective pattern SDL-3 and may extend to the module hole MH. Here, the second inorganic layer 433 may define an inner surface of the third recess pattern GV3. The first inorganic layer 413 and the second inorganic layer 433 may be in contact with each other in the third recess pattern GV3 according to the present embodiment. The organic layer 423 and the protective pattern SDL-3 may not overlap with the third recess pattern GV3 when viewed in a plan view. Since the electronic panel 100-3 according to the present embodiment further comprises the third recess pattern GV3, the organic layer 423 may be separated from the protective pattern SDL-3. In addition, since the electronic panel 100-3 comprises the plurality of partitions SP1 and SP2, it is possible to prevent or reduce instances of the protective pattern SDL-3 and the organic layer 423 extending to the third recess pattern GV3. Furthermore, positions of the protective pattern SDL-3 and the organic layer 423 may be easily controlled by the partitions SP1 and SP2 such that the protective pattern SDL-3 and the organic layer 423 stably fill the first recess pattern GV1 and the second recess pattern GV2, respectively.

FIGS. 8A to 8D are cross-sectional views illustrating electronic panels according to some embodiments of the inventive concepts. FIGS. 8A to 8D schematically illustrate hole areas PA of electronic panels 100-4, 100-5, 100-6 and 100-7. Hereinafter, some embodiments of the inventive concepts will be described with reference to FIGS. 8A to 8D. In addition, the same components as described with reference to FIGS. 1 to 7B will be indicated by the same reference numerals or designators, and the descriptions thereto will be omitted for the purpose of ease and convenience of description.

Figure 8A:
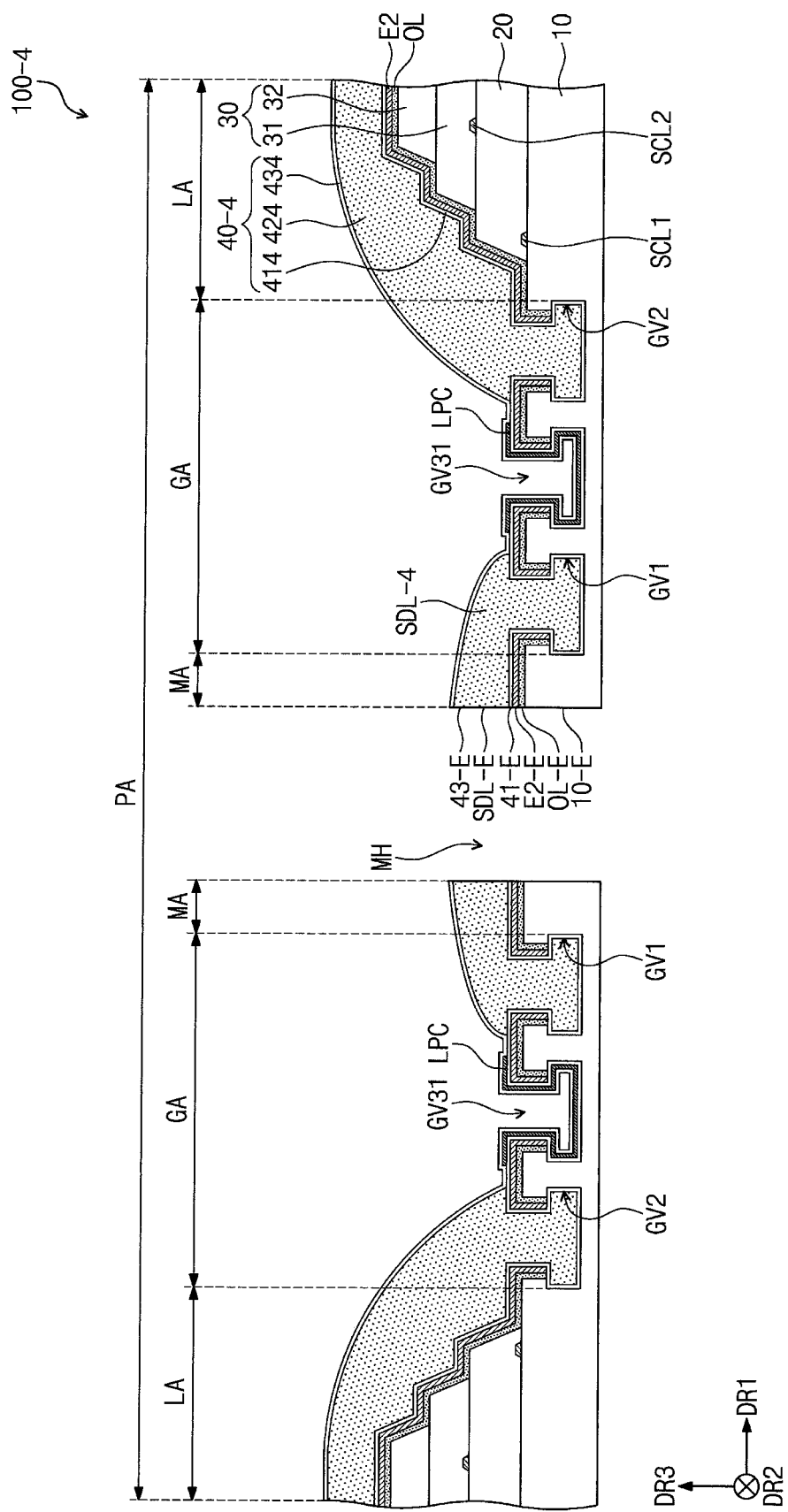
FIGS. 8A to 8D are cross-sectional views illustrating electronic panels according to some example embodiments.

As illustrated in FIG. 8A, the electronic panel 100-4 may further comprise a liquid-repellent pattern LPC. The liquid-repellent pattern LPC may be located at a third recess pattern GV31. The liquid-repellent pattern LPC may be located between a first inorganic layer 414 and a second inorganic layer 434 of an encapsulation layer 40-4, which extend into the groove area GA. Thus, the liquid-repellent pattern LPC may be covered by the second inorganic layer 434 defining an inner surface of the third recess pattern GV31 and thus may not be exposed to the outside.

The liquid-repellent pattern LPC may comprise a liquid-repellent material. For example, the liquid-repellent pattern LPC may comprise a material having a low affinity for a protective pattern SDL-4 or the organic layer 424. For example, an affinity between the protective pattern SDL-4 and the liquid-repellent pattern LPC may be lower than an affinity between the protective pattern SDL-4 and the first inorganic layer 414. In addition, an affinity between the organic layer 424 and the liquid-repellent pattern LPC may be lower than an affinity between the organic layer 424 and the first inorganic layer 414.

Thus, the organic layer 424 and the protective pattern SDL-4 may not be in contact with the liquid-repellent pattern LPC. According to the present embodiment, since the electronic panel 100-4 further comprises the liquid-repellent pattern LPC, positions of the organic layer 424 and the protective pattern SDL-4 may be easily controlled without additional partitions. In addition, the liquid-repellent pattern LPC may inhibit the protective pattern SDL-4 or the organic layer 424 from filling the third recess pattern GV31, and thus the protective pattern SDL-4 may be easily separated from the organic layer 424.

Figure 8B:
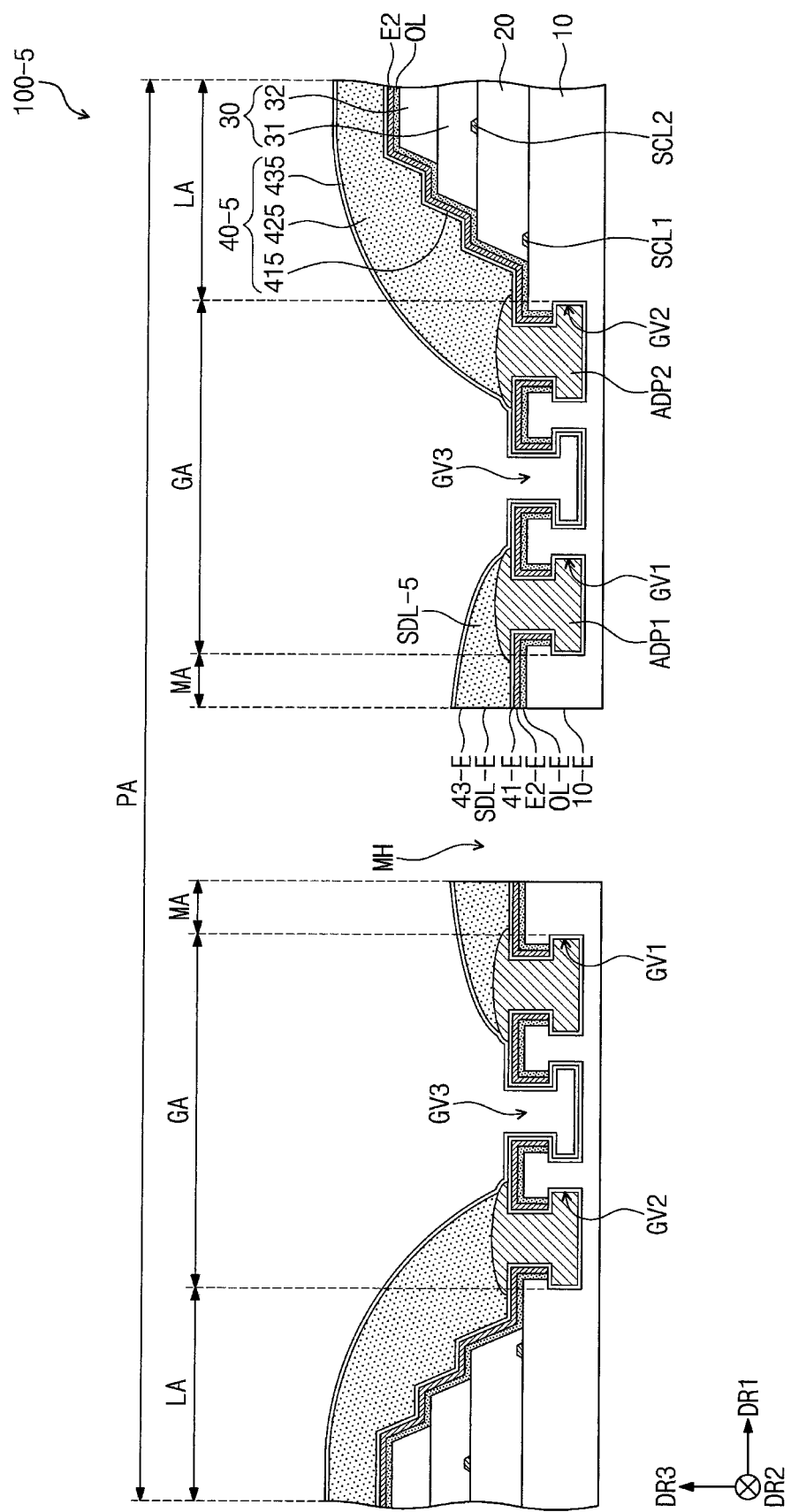

As illustrated in FIG. 8B, the electronic panel 100-5 may further comprise a lyophilic pattern ADP1 and ADP2. The lyophilic pattern ADP1 and ADP2 may be provided in plurality, and the plurality of lyophilic patterns ADP1 and ADP2 may comprise a first lyophilic pattern ADP1 and a second lyophilic pattern ADP2, which are spaced apart from each other. The first and second lyophilic patterns ADP1 and ADP2 may fill the first and second recess patterns GV1 and GV2, respectively.

The first lyophilic pattern ADP1 may fill the first recess pattern GV1. A protective pattern SDL-5 may cover the margin area MA and the first recess pattern GV1. The protective pattern ADL-5 may cover the first lyophilic pattern ADP1.

The first lyophilic pattern ADP1 may comprise a material having a high affinity for the protective pattern SDL-5. For example, the affinity between the first lyophilic pattern ADP1 and the protective pattern SDL-5 may be greater than an affinity between a first inorganic layer 415 and the protective pattern SDL-5. Thus, the protective pattern SDL-5 may not extend from the first lyophilic pattern ADP1 to the third recess pattern GV3. As a result, the third recess pattern GV3 may be spaced apart from the protective pattern SDL-5.

The second lyophilic pattern ADP2 may fill the second recess pattern GV2. An organic layer 425 may cover the line area LA and the second recess pattern GV2. The organic layer 425 may cover the second lyophilic pattern ADP2.

The second lyophilic pattern ADP2 may comprise a material having a high affinity for the organic layer 425. For example, the affinity between the second lyophilic pattern ADP2 and the organic layer 425 may be greater than an affinity between the first inorganic layer 415 and the organic layer 425. Thus, the organic layer 425 may not extend from the second lyophilic pattern ADP2 to the third recess pattern GV3. As a result, the third recess pattern GV3 may be spaced apart from the organic layer 425. The first inorganic layer 415, the organic layer 425 and a second inorganic layer 435 may constitute an encapsulation layer 40-5.

Figure 8C:
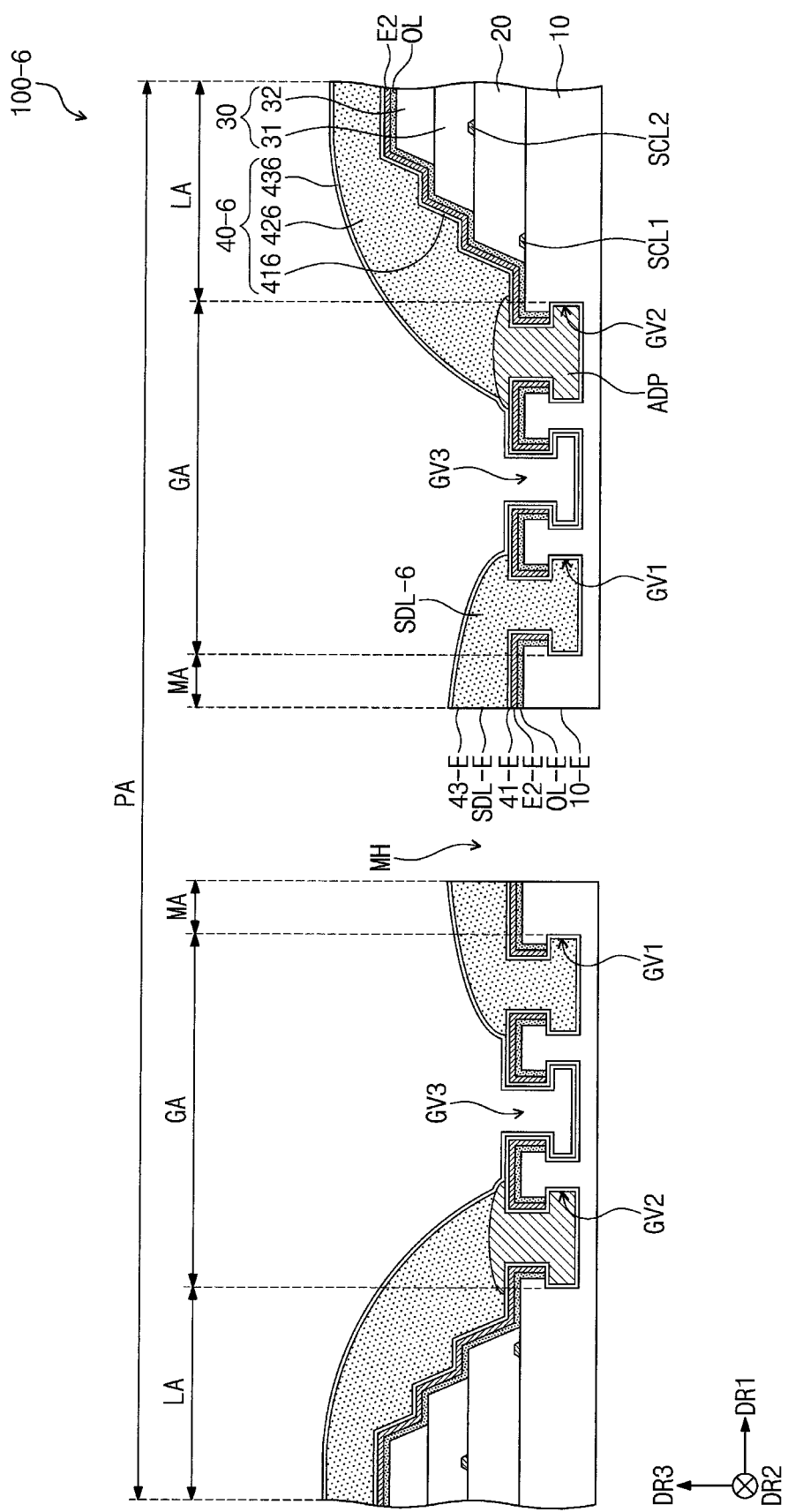

As illustrated in FIG. 8C, the electronic panel 100-6 may comprise a single lyophilic pattern ADP. The lyophilic pattern ADP may fill the second recess pattern GV2. The lyophilic pattern ADP may easily prevent or reduce instances of an organic layer 426 extending to the third recess pattern GV3.

In an embodiment, a protective pattern SDL-6 may comprise the same material as the lyophilic pattern ADP in the electronic panel 100-6. In this case, the lyophilic pattern ADP and the protective pattern SDL-6 may comprise a material that has a high affinity for the organic layer 426 and a high absorption rate for laser light. According to the present embodiment, the protective pattern SDL-6 may be formed of the same material as the lyophilic pattern ADP, and thus a process cost may be reduced and manufacturing processes may be simplified, when the electronic panel 100-6 is manufactured. First and second inorganic layers 416 and 436 and the organic layer 426 may constitute an encapsulation layer 40-6.

Figure 8D:
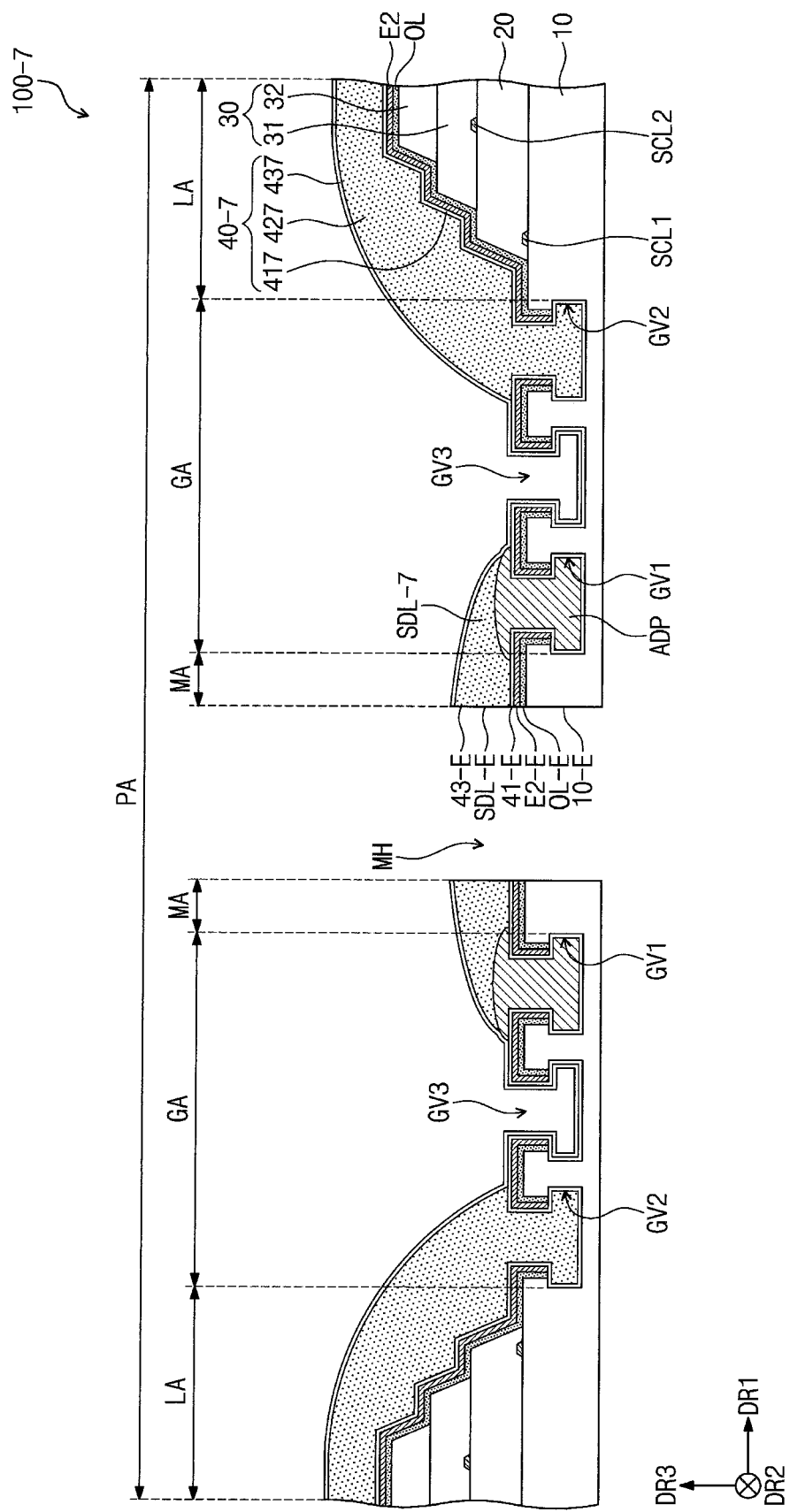

As illustrated in FIG. 8D, in the electronic panel 100-7, the lyophilic pattern ADP may fill the first recess pattern GV1. Thus, an organic layer covering the first recess pattern GV1 may have a stack structure comprising the lyophilic pattern ADP and a protective pattern SDL-7, and an organic layer covering the second recess pattern GV2 may have a single-layered structure of an organic layer 427. The protective pattern SDL-7 and the organic layer 427 may be formed of the same material or different materials. For example, the protective pattern SDL-7 and the organic layer 427 may be formed of the same material at the same time by the same process, and thus manufacturing processes may be simplified and a process cost may be reduced. Alternatively, the protective pattern SDL-7 may be formed of a material having a relatively high absorption rate for light, and the organic layer 427 may be formed of a material having a high planarization characteristic. Thus, the protective pattern SDL-7 and the organic layer 427 may be formed independently of each other to correspond to their functions, respectively. First and second inorganic layers 417 and 437 and the organic layer 427 may constitute an encapsulation layer 40-7.

The lyophilic pattern ADP may easily prevent or reduce instances of the protective pattern SDL-7 extending to the third recess pattern GV3, and thus it is possible to stably form the protective pattern SDL-7 selectively covering the first recess pattern GV1. Meanwhile, in other embodiments, the recess patterns of the electronic panel may be selectively filled with at least one of other various stack structures.

FIGS. 9A to 9H are cross-sectional views illustrating a method of manufacturing an electronic panel, according to an embodiment of the inventive concepts. FIGS. 9A to 9H illustrate a method of manufacturing the electronic panel 100 illustrated in FIG. 4C, and some components are omitted in FIGS. 9A to 9H for the purpose of ease and convenience of description. Hereinafter, a manufacturing method according to an embodiment of the inventive concepts will be described with reference to FIGS. 9A to 9H. In addition, the same components as described with reference to FIGS. 1 to 8D will be indicated by the same reference numerals or designators, and the descriptions thereto will be omitted for the purpose of ease and convenience of description.

Figure 9A:
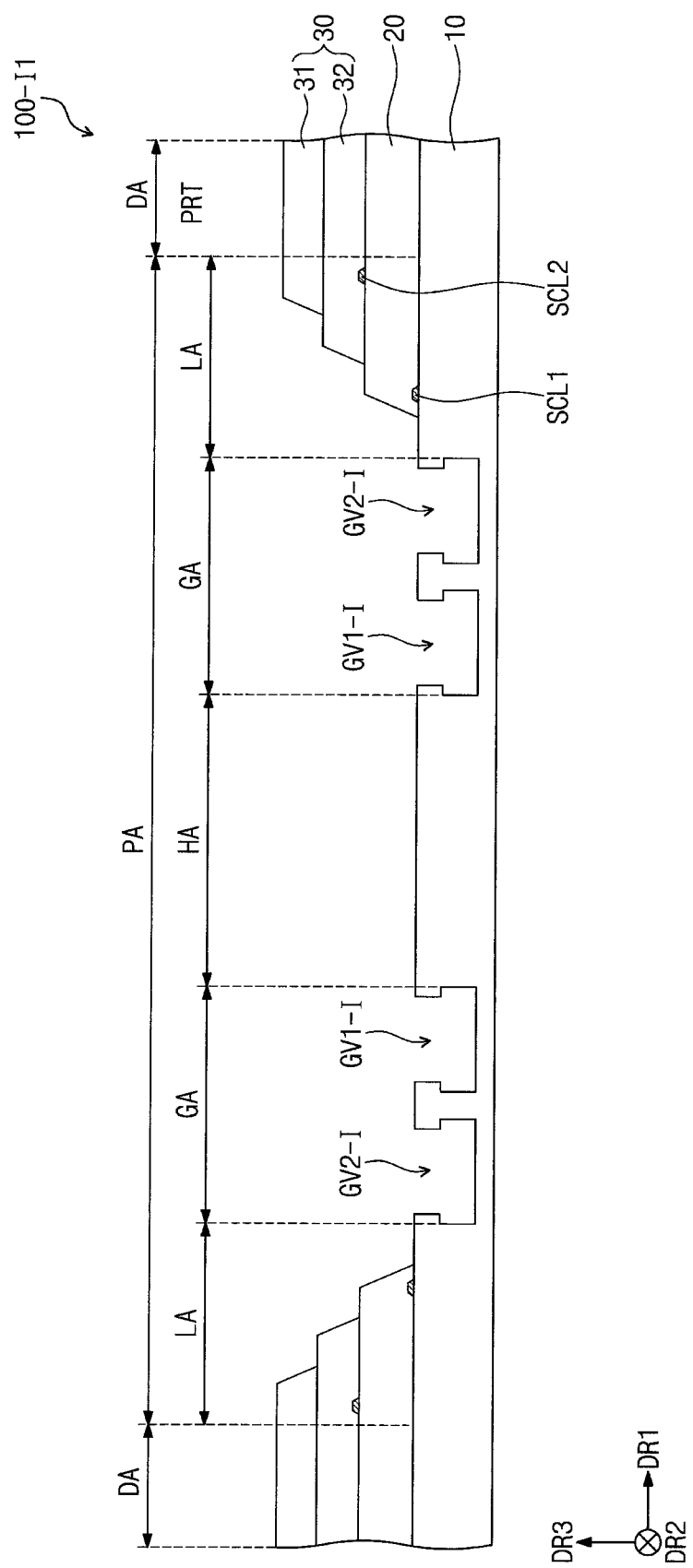
FIGS. 9A to 9H are cross-sectional views illustrating a method of manufacturing an electronic panel, according to some example embodiments.

As illustrated in FIG. 9A, a first initial substrate 100-11 may be provided. The first initial substrate 100-11 may comprise a hole area PA and a display area DA. The hole area PA may comprise a line area LA in which signal lines SCL1 and SCL2 are located, a groove area GA in which a plurality of initial recess patterns GV1-I and GV2-I is formed, and a module hole area HA which is surrounded by the groove area GA.

The initial recess patterns GV1-I and GV2-I may comprise a first initial recess pattern GV1-I and a second initial recess pattern GV2-I, which are spaced apart from each other. Each of the first and second initial recess patterns GV1-I and GV2-I may be formed by removing a portion of an insulating substrate 10. Each of the first and second initial recess patterns GV1-I and GV2-I may be a space that is recessed from a top surface of the insulating substrate 10 and is closed by a rear surface of the insulating substrate 10. In the present embodiment, the first and second initial recess patterns GV1-I and GV2-I may have undercut shapes. The undercut shapes may be due to a difference in etch rate between the base layer comprising an organic material and the auxiliary layer comprising an inorganic material.

Figure 9B:
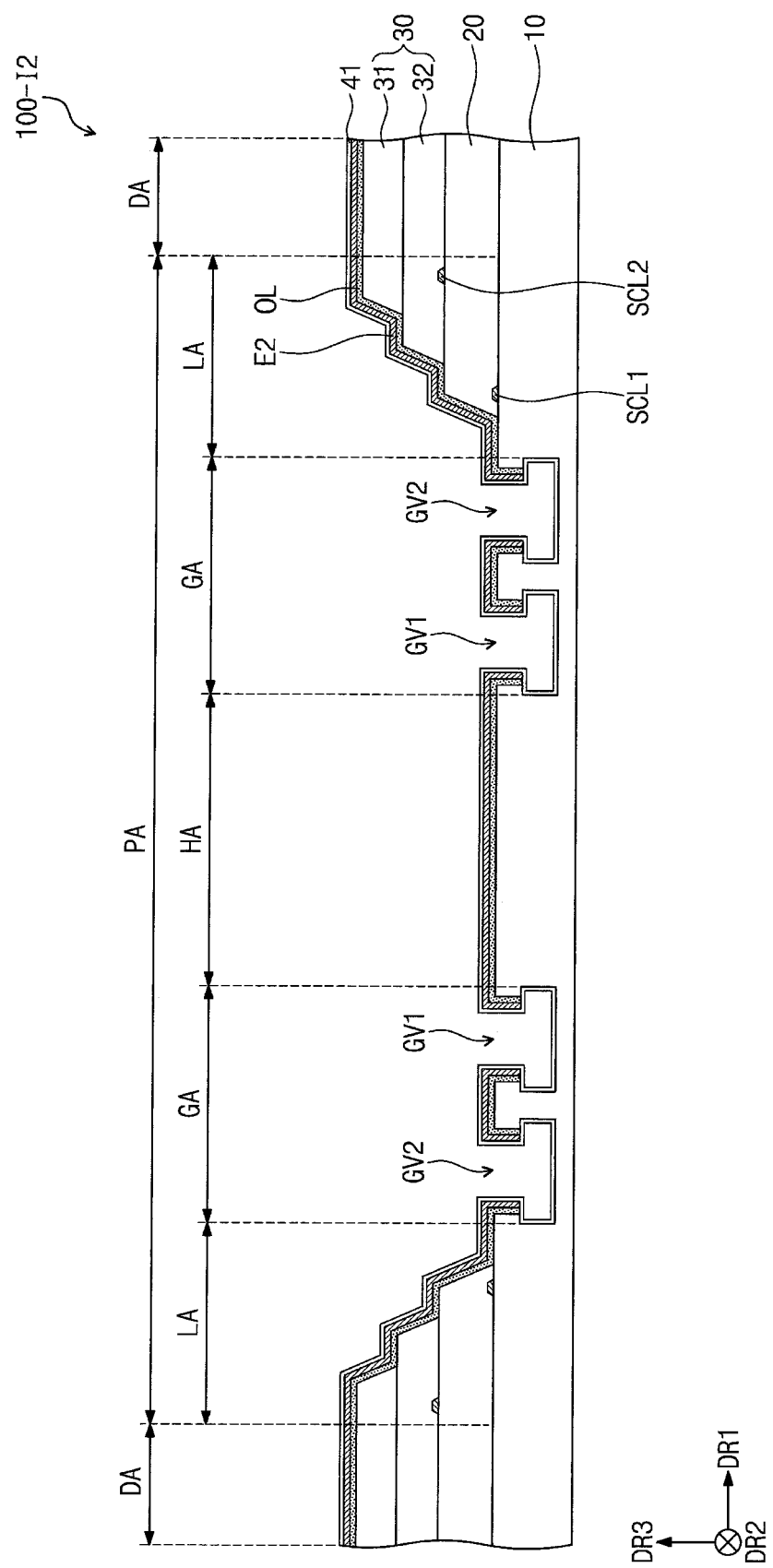

Referring to FIG. 9B, a control layer OL, a second electrode E2 and a first inorganic layer 41 may be formed on the first initial substrate 100-11 to form a second initial substrate 100-12. In an embodiment, the control layer OL and the second electrode E2 may be formed by evaporation processes. The control layer OL may be formed by evaporating an organic material. The second electrode E2 may be formed by evaporating a conductive material. The conductive material may comprise a metal and/or a conductive oxide.

At this time, the control layer OL and the second electrode E2 may be anisotropically formed. Since the control layer OL and the second electrode E2 are formed by the evaporation processes performed on a front surface of the first initial substrate 100-11, the control layer OL and the second electrode E2 may not be formed on portions of the first initial substrate 100-11 which are not visible in front of the first initial substrate 100-11. In an embodiment, portions of the control layer OL and the second electrode E2 may be formed in the first and second initial recess patterns GV1-I and GV2-I. In this case, the portions of the control layer OL and the second electrode E2 may be separated from the control layer OL and the second electrode E2 located outside the initial recess patterns GV1-I and GV2-I.

Thereafter, the first inorganic layer 41 may be formed. The first inorganic layer 41 may be formed by a deposition process. For example, the first inorganic layer 41 may be formed of an inorganic material by a chemical vapor deposition (CVD) process. At this time, the first inorganic layer 41 may be isotropically formed. The first inorganic layer 41 may be formed along a profile of the undercut shape. Thus, a first recess pattern GV1 and a second recess pattern GV2 which have inner surfaces defined by the first inorganic layer 41 may be formed.

Figure 9C:
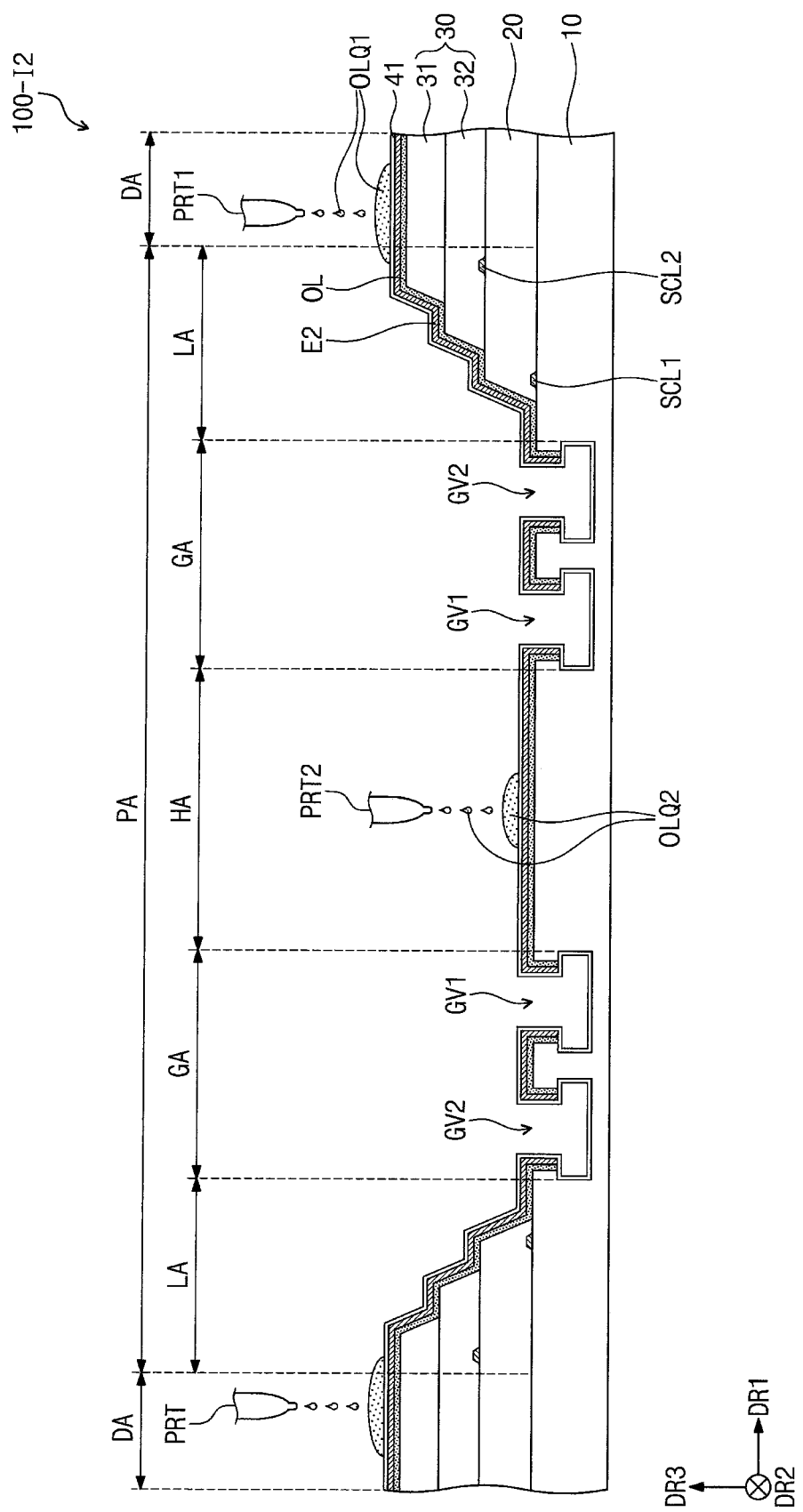
Figure 9D:
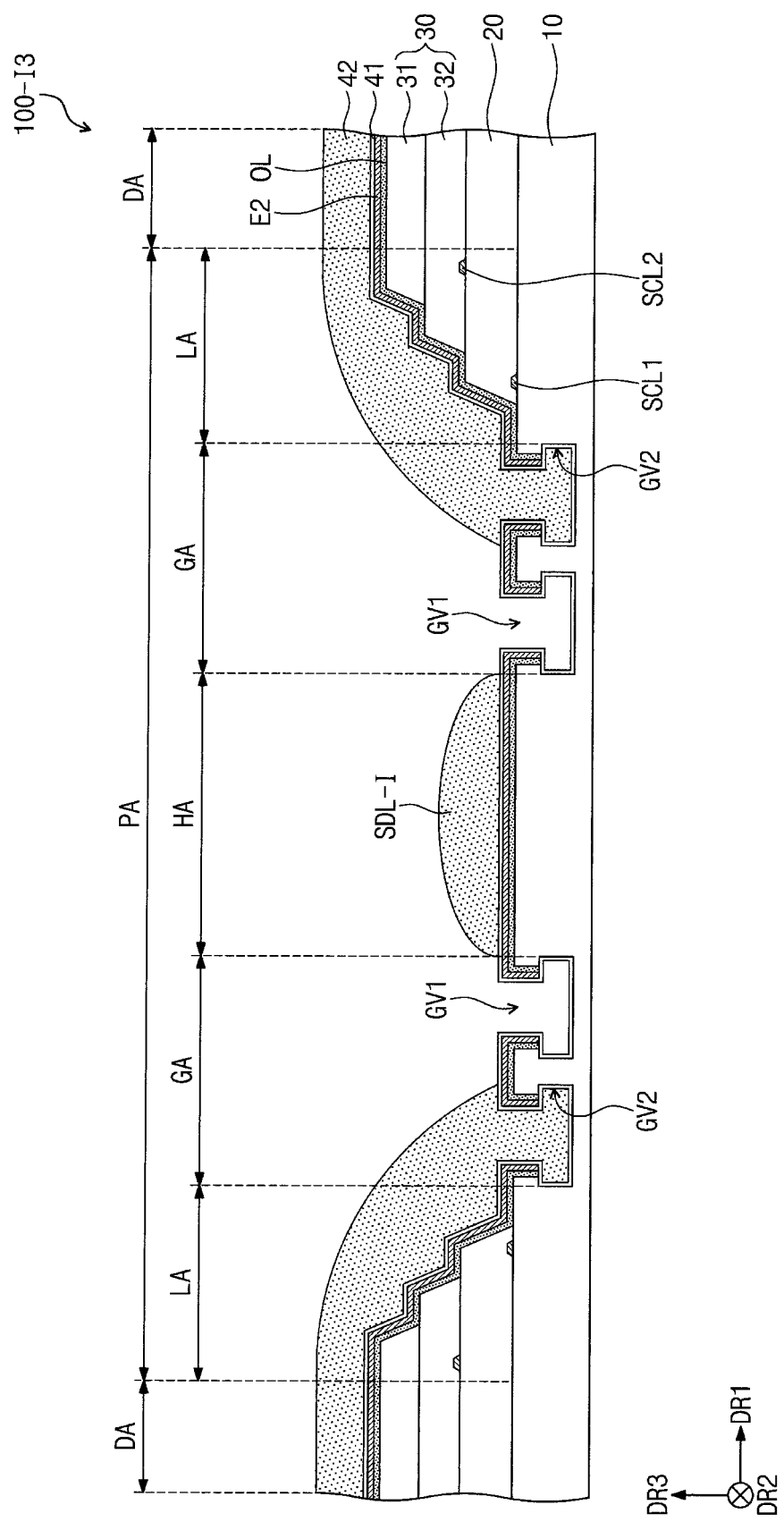

Referring to FIGS. 9C and 9D, a first organic material OLQ1 and a second organic material OLQ2 may be provided onto the second initial substrate 100-12 to form a third initial substrate 100-13 having an organic layer 42 and an initial protective pattern SDL-I.

A first liquid supply unit PRT1 may provide the first organic material OLQ1 to the display area DA. In the present embodiment, the first organic material OLQ1 may comprise a monomer.

The first organic material OLQ1 may be provided in a liquid form. The first organic material OLQ1 may extend from the display area DA into the hole area PA due to its viscosity. The first liquid supply unit PRT1 according to the present embodiment may control the amount and a supply rate of the first organic material OLQ1 in such a way that the extension of the first organic material OLQ1 is stopped before the first organic material OLQ1 reaches the first recess pattern GV1.

Thereafter, the first organic material OLQ1 may be hardened to form the organic layer 42. The organic layer 42 may fill the second recess pattern GV2 and may be spaced apart from the first recess pattern GV1.

A second liquid supply unit PRT2 may be spaced apart from the first liquid supply unit PRT1 and may provide the second organic material OLQ2 to the module hole area HA. In the present embodiment, the second organic material OLQ2 may comprise a material having a high absorption rate for light having a wavelength corresponding to that of laser light.

The second organic material OLQ2 may be provided in a liquid form. The second organic material OLQ2 may extend from a center of the module hole area HA due to its viscosity as an area covered by the second organic material OLQ2 increases. Thereafter, the second organic material OLQ2 may be hardened to form the initial protective pattern SDL-I. The initial protective pattern SDL-I may extend from the center of the module hole area HA and may be spaced apart from the second recess pattern GV2.

In the present embodiment, the first organic material OLQ1 and the second organic material OLQ2 may comprise the same material. For example, the first organic material OLQ1 and the second organic material OLQ2 may comprise a monomer having a high absorption rate for light. In this case, the organic layer 42 and the initial protective pattern SDL-I may be formed at the same time by a single hardening process, and thus a process cost and a process time may be reduced.

Alternatively, the first organic material OLQ1 and the second organic material OLQ2 may comprise different materials from each other. In this case, the organic layer 42 and the initial protective pattern SDL-I may be sequentially formed, and the formation of each of the organic layer 42 and the initial protective pattern SDL-I may be stably controlled.

Figure 9E:
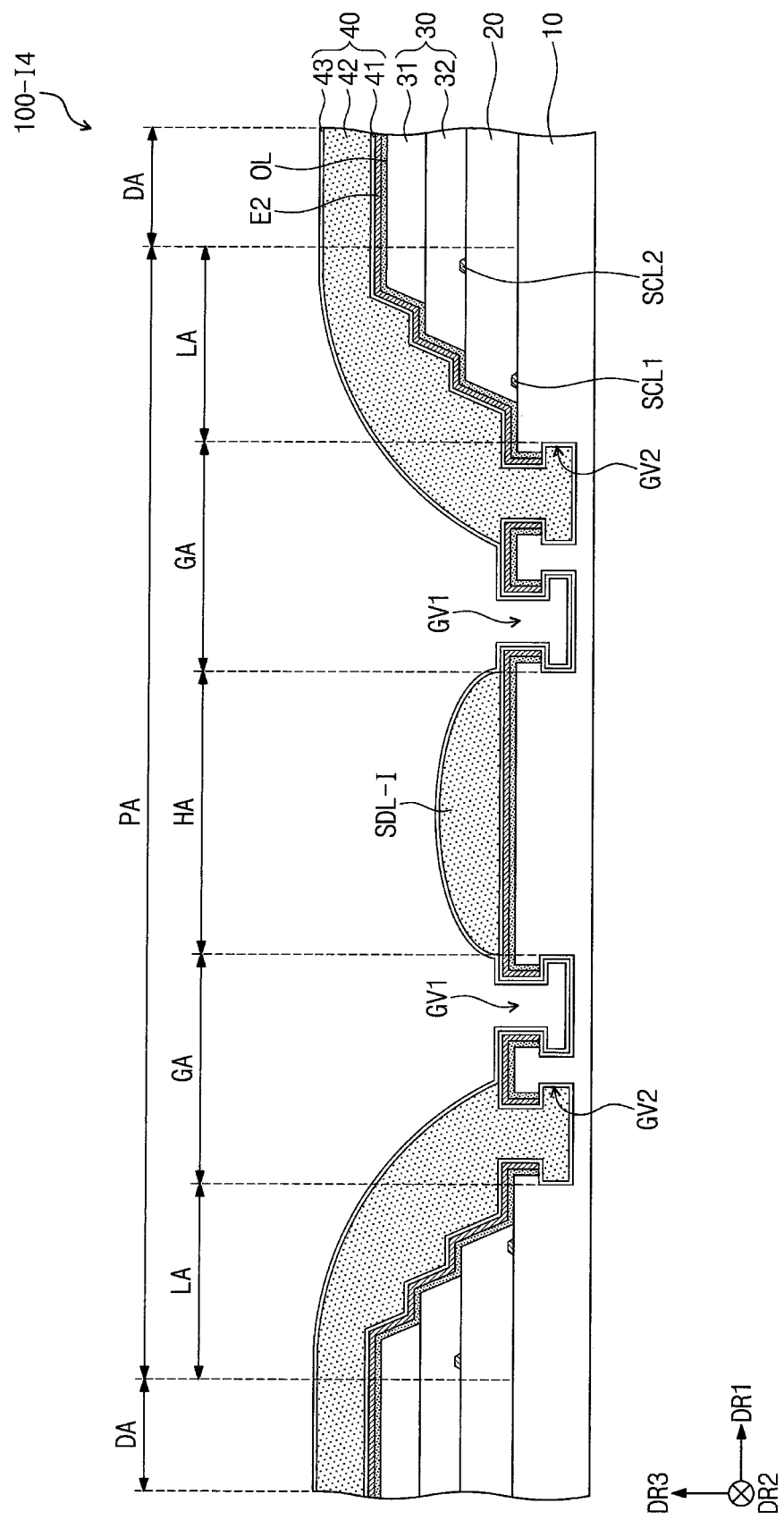

Referring to FIG. 9E, a second inorganic layer 43 may be formed on the third initial substrate 100-13 to form a fourth initial substrate 100-14. The second inorganic layer 43 may be formed by depositing an inorganic material. The second inorganic layer 43 may cover the organic layer 42, the first recess pattern GV1, and the initial protective pattern SDL-I.

Figure 9F:
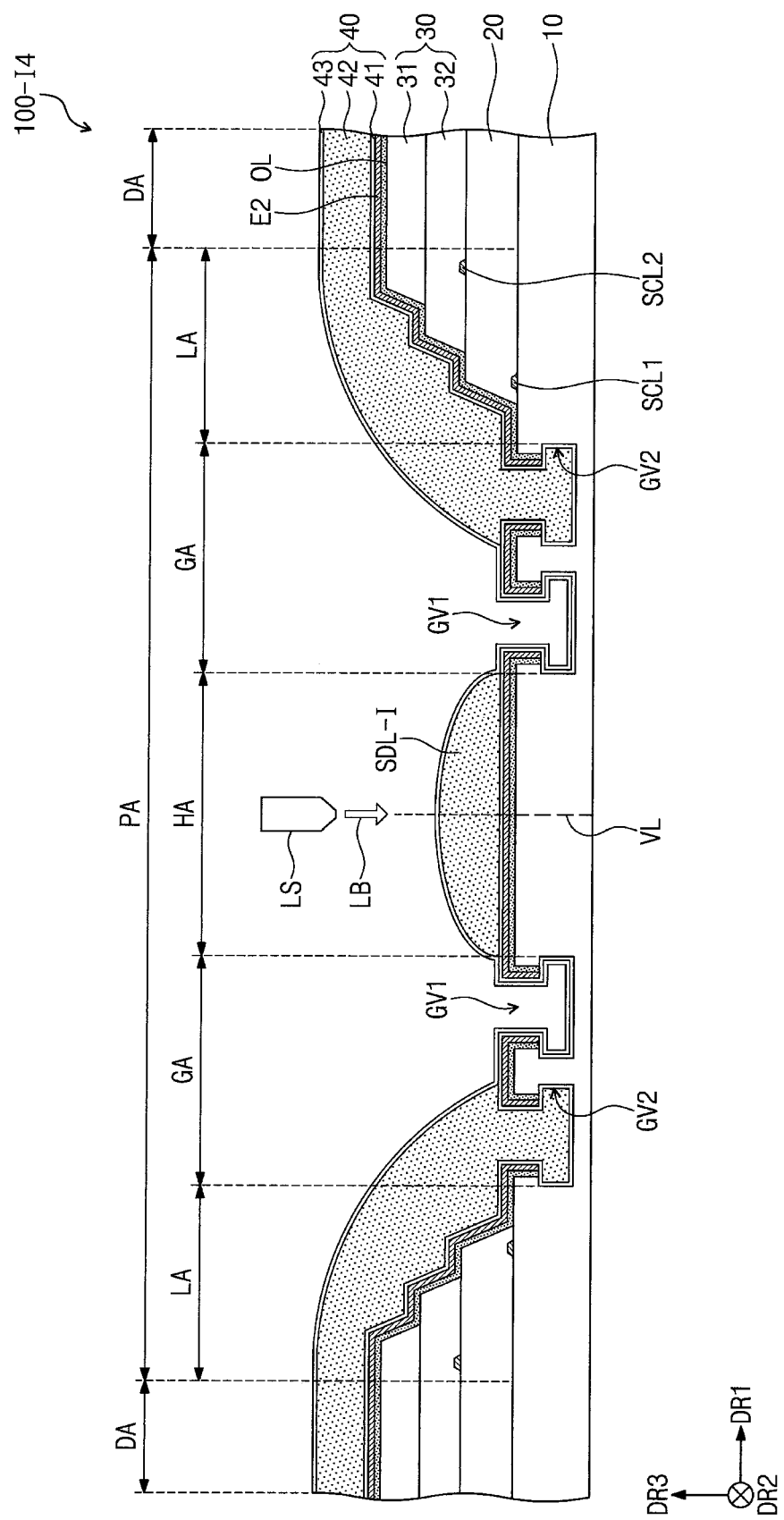
Figure 9G:
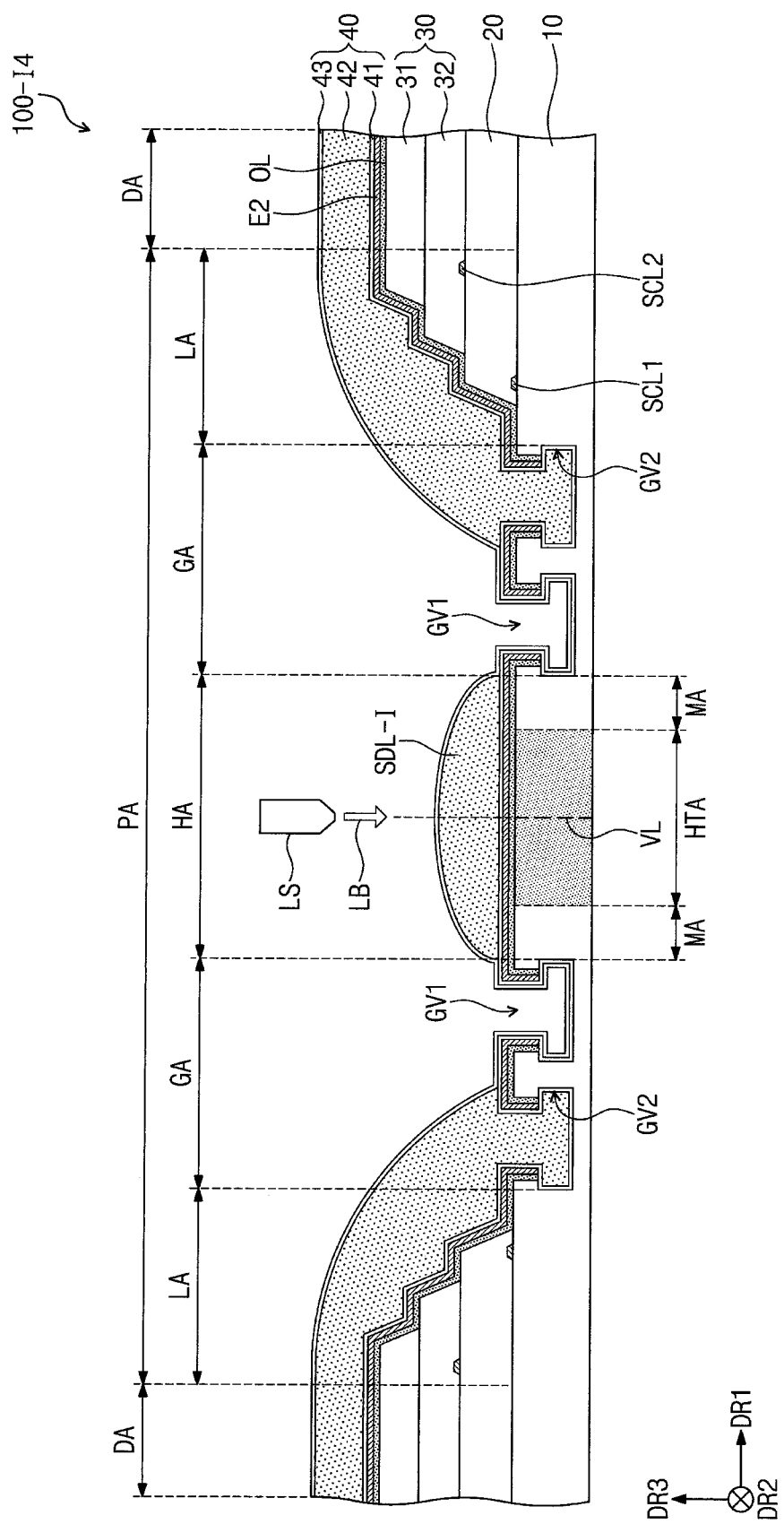
Figure 9H:
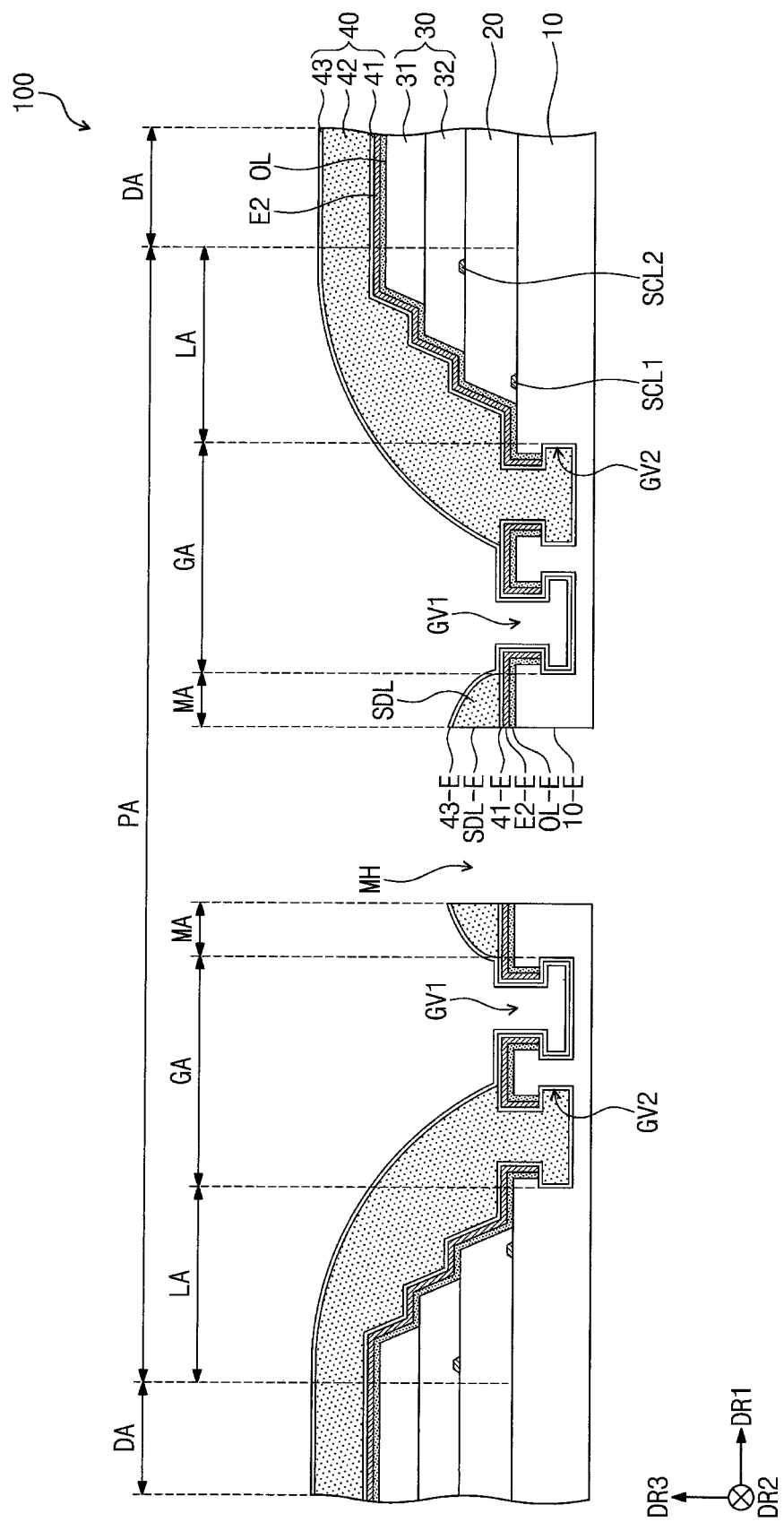

Thereafter, a module hole MH may be formed in the fourth initial substrate 100-14 to manufacture the electronic panel 100, as illustrated in FIGS. 9F to 9H. The module hole MH may be formed by irradiating laser light LB.

For example, as illustrated in FIG. 9F, the laser light LB may be irradiated to the fourth initial substrate 100-14 by using a laser irradiating unit LS. The laser light LB may be irradiated to the center of the module hole area HA. In the present embodiment, an imaginary line VL corresponding to the center of the module hole area HA is illustrated. The laser light LB may be aligned in parallel to the imaginary line VL and then may be irradiated.

Thereafter, portions of components of the fourth initial substrate 100-14, to which the laser light LB is irradiated, may be thermally damaged and removed as illustrated in FIG. 9G. The module hole area HA may be divided into a heating area HTA and a margin area MA.

The heating area HTA is shaded in FIG. 9G for the purpose of ease and convenience of description. The heating area HTA may be an area thermally damaged by the laser light LB. The heating area HTA may be a thermally damaged area which is removable by the laser light LB.

The margin area MA may be defined between the heating area HTA and the groove area GA and may be adjacent to the heating area HTA. The margin area MA may surround the heating area HTA. A degree of thermal damage of the margin area MA may be lower than a degree of thermal damage of the heating area HTA. For example, the margin area MA may not be thermally damaged. Alternatively, the margin area MA may be thermally damaged but may not be removed by the laser light LB.

Meanwhile, the initial protective pattern SDL-I may absorb light having a wavelength corresponding to that of the laser light LB. The initial protective pattern SDL-I may inhibit extension of the area damaged by the laser light LB. A portion of the laser light LB may be absorbed in the initial protective pattern SDL-I, and thus irregular extension of the heating area HTA may be prevented or reduced. In addition, the laser light LB may be weakened by the initial protective pattern SDL-I and then may be irradiated to the control layer OL and/or the second electrode E2, and thus damage of the control layer OL and/or the second electrode E2 may be reduced in the margin area MA. As a result, an area (or a size) of the margin area MA may be reduced, and thus a process cost may be reduced and/or performance of the electronic panel 100 may be improved.

Thereafter, the electronic panel 100 comprising the module hole MH may be manufactured as illustrated in FIG. 9H. The module hole MH may be formed by the laser light LB. The module hole MH may penetrate the second inorganic layer 43, the initial protective pattern SDL-I, the first inorganic layer 41, the second electrode E2, the control layer OL, and the insulating substrate 10. An inner surface of the module hole MH may be defined by a sidewall 43-E of the second inorganic layer, a sidewall SDL-E of the protective pattern, a sidewall 41-E of the first inorganic layer, a sidewall E2-E of the second electrode, a sidewall OL-E of the control layer, and a sidewall 10-E of the insulating substrate, which are cut by the laser light LB.

According to an embodiment of the inventive concepts, the initial protective pattern SDL-I may be cut by the laser light LB so as to be formed into the protective pattern SDL surrounding the module hole MH. A degree of the damage of the margin area MA by the laser light LB may be reduced by the initial protective pattern SDL-I, and thus the inner surface of the module hole MH may be stably formed. As a result, process reliability of the electronic panel 100 may be improved.

According to the embodiments of the inventive concepts, it is possible to prevent or reduce instances of the elements being damaged by an external contaminant provided through the hole, and thus the reliability of the electronic panel may be improved. In addition, thermal damage occurring in the formation of the hole may be reduced or inhibited, and thus the process reliability of the electronic panel may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An electronic panel comprising:
   a plurality of recess patterns adjacent to a through-hole penetrating the electronic panel, each of the plurality of recess patterns comprising a tip portion laterally protruding toward a center of the recess pattern; and
   a plurality of organic light emitting elements in a display area surrounding the plurality of recess patterns, each of the plurality of organic light emitting elements comprising a first electrode, a second electrode disposed on the first electrode, and an emission layer between the first electrode and the second electrode,
   wherein a portion of the second electrode covers a lateral surface of the tip portion,
   wherein the plurality of organic light emitting elements further comprises a control layer between the first electrode and the second electrode, and a portion of the control layer covers the lateral surface of the tip portion.

2. The electronic panel of claim 1, wherein the control layer is disposed between the emission layer and the second electrode in the display area.

3. The electronic panel of claim 1, wherein the control layer is disposed between the first electrode and the emission layer in the display area.

4. The electronic panel of claim 1, wherein the control layer comprises a plurality of layers with the emission layer interposed therebetween in the display area.

5. The electronic panel of claim 1, wherein each of the plurality of recess patterns surrounds the through-hole when viewed in a plan view.

6. The electronic panel of claim 1, wherein each of the plurality of recess patterns recessed have an undercut shape.

7. The electronic panel of claim 1, further comprising:
   an encapsulation layer covering the plurality of organic light emitting elements and comprising a first inorganic layer, a second inorganic layer, and an organic layer between the first and second inorganic layers,
   wherein one of the recess patterns is spaced apart from the organic layer, and
   wherein another of the recess patterns is filled with the organic layer to cover the tip portion of the another of the recess patterns.

8. The electronic panel of claim 7, wherein the first inorganic layer extends from the display area into the plurality of the recess patterns, and covers the portion of the second electrode and the plurality of the recess patterns.

9. The electronic panel of claim 7, further comprising:
   a lyophilic pattern at the another of the recess patterns is filled with the organic layer,
   wherein the lyophilic pattern is covered by the organic layer.

10. The electronic panel of claim 7, further comprising:
    a liquid-repellent pattern at the one of the recess patterns and spaced apart from the organic layer,
    wherein the liquid-repellent pattern is covered by the second inorganic layer.

11. The electronic panel of claim 7, further comprising:
    a protective pattern surrounding the through-hole,
    wherein the protective pattern is spaced apart from the organic layer with at least one of the recess patterns interposed therebetween when viewed in a plan view.

12. The electronic panel of claim 11, wherein at least one of the recess patterns spaced apart from the organic layer is filled with the protective pattern.

13. The electronic panel of claim 11, further comprising:
    a partition between the protective pattern and the organic layer when viewed in the plan view,
    wherein the partition is spaced apart from the recess patterns when viewed in the plan view.

14. The electronic panel of claim 13, wherein the partition surrounds the through-hole.

15. An electronic apparatus comprising:
    an electronic panel and a camera module, the electronic panel having a through-hole overlapping the camera module, wherein the electronic panel comprises:

a plurality of organic light emitting elements, each of the plurality of organic light emitting elements comprising a first electrode, a second electrode disposed on the first electrode, and an emission layer between the first electrode and the second electrode; and a plurality of recess patterns between the through-hole and the plurality of organic light emitting elements in a plan view, each of the plurality of recess patterns comprising a tip portion laterally protruding toward a center of the recess pattern, wherein the first electrode is spaced from the plurality of recess patterns, and a portion of the second electrode covers a lateral surface of the tip portion, wherein the plurality of organic light emitting elements further comprises a control layer between the first electrode and the second electrode, and a portion of the control layer covers the lateral surface of the tip portion.

16. The electronic apparatus of claim 15, further comprising:

an encapsulation layer covering the plurality of organic light emitting elements and comprising a first inorganic layer, a second inorganic layer, and an organic layer between the first and second inorganic layers, wherein the first inorganic layer covers the portion of the second electrode and the plurality of the recess patterns, and wherein one of the recess patterns is spaced apart from the organic layer, and another of the recess patterns is filled with the organic layer.

17. The electronic apparatus of claim 15, wherein each of the plurality of recess patterns surrounds the through-hole when viewed in the plan view.

18. The electronic apparatus of claim 15, wherein each of the plurality of recess patterns recessed has an undercut shape.

* * * * *